(12) United States Patent
Liu et al.

(10) Patent No.: US 10,000,862 B2
(45) Date of Patent: Jun. 19, 2018

(54) METHOD OF MAKING QUANTUM DOTS

(71) Applicant: SAMSUNG ELECTRONICS CO., LTD., Suwon-si (KR)

(72) Inventors: Wenhao Liu, Billerica, MA (US); Craig Breen, Somerville, MA (US)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 143 days.

(21) Appl. No.: 14/284,251

(22) Filed: May 21, 2014

(65) Prior Publication Data

US 2015/0013589 A1 Jan. 15, 2015

Related U.S. Application Data

(63) Continuation of application No. PCT/US2012/066140, filed on Nov. 20, 2012.

(60) Provisional application No. 61/562,459, filed on Nov. 22, 2011, provisional application No. 61/678,877, filed on Aug. 2, 2012.

(51) Int. Cl.
| | |
|---|---|
| *H01L 21/02* | (2006.01) |
| *C30B 7/14* | (2006.01) |
| *B82Y 30/00* | (2011.01) |
| *B22F 1/00* | (2006.01) |
| *B22F 9/24* | (2006.01) |
| *C30B 7/00* | (2006.01) |
| *C30B 7/08* | (2006.01) |
| *C30B 19/12* | (2006.01) |
| *C30B 29/48* | (2006.01) |
| *C30B 29/68* | (2006.01) |

(Continued)

(52) U.S. Cl.
CPC .............. *C30B 7/14* (2013.01); *B22F 1/0018* (2013.01); *B22F 9/24* (2013.01); *B82Y 30/00* (2013.01); *C30B 7/005* (2013.01); *C30B 7/08* (2013.01); *C30B 19/12* (2013.01); *C30B 29/48* (2013.01); *C30B 29/68* (2013.01); *H01L 21/0256* (2013.01); *H01L 21/02521* (2013.01); *H01L 21/02557* (2013.01); *H01L 21/02601* (2013.01); *H01L 21/02628* (2013.01); *B82Y 40/00* (2013.01); *H01L 21/10* (2013.01)

(58) Field of Classification Search
CPC ........... H01L 21/02601; H01L 21/0256; H01L 21/02557; H01L 21/10
See application file for complete search history.

(56) References Cited

U.S. PATENT DOCUMENTS

| | | |
|---|---|---|
| 3,760,000 A | 9/1973 | Curry |
| 6,322,901 B1 | 11/2001 | Bawendi et al. |

(Continued)

FOREIGN PATENT DOCUMENTS

| | | |
|---|---|---|
| WO | 2008063658 A2 | 5/2008 |
| WO | 2013078242 A1 | 5/2013 |

(Continued)

OTHER PUBLICATIONS

Bala et al., "Interaction of Different Metal Ions with Carboxylic Acid Group: A Quantative Study"; J. Phys/ Chem. A; 2007; 111; 6183-6190.

(Continued)

*Primary Examiner* — Matthew Song
(74) *Attorney, Agent, or Firm* — Cantor Colburn LLP

(57) ABSTRACT

Quantum dots and methods of making quantum dots are provided.

16 Claims, 3 Drawing Sheets

(51) Int. Cl.
*H01L 21/10* (2006.01)
*B82Y 40/00* (2011.01)

(56) References Cited

U.S. PATENT DOCUMENTS

| | | | |
|---|---|---|---|
| 6,607,829 B1 | 8/2003 | Bawendi et al. | |
| 6,815,064 B2 * | 11/2004 | Treadway | C09K 11/08 257/E33.004 |
| 7,229,497 B2 | 6/2007 | Stott et al. | |
| 7,267,810 B2 | 9/2007 | Yu et al. | |
| 7,476,599 B2 | 1/2009 | Wang et al. | |
| 7,482,059 B2 | 1/2009 | Peng et al. | |
| 7,767,260 B2 | 8/2010 | Peng et al. | |
| 7,824,731 B2 | 11/2010 | Ying et al. | |
| 7,919,012 B2 | 4/2011 | Peng et al. | |
| 8,377,333 B2 | 2/2013 | Ramprasad et al. | |
| 8,404,154 B2 | 3/2013 | Breen et al. | |
| 8,691,114 B2 | 4/2014 | Ramprasad et al. | |
| 8,718,437 B2 | 5/2014 | Coe-Sullivan et al. | |
| 8,876,272 B2 | 11/2014 | Linton et al. | |
| 8,906,265 B2 | 12/2014 | Breen et al. | |
| 8,980,133 B2 | 3/2015 | Ramprasad | |
| 9,054,329 B2 | 6/2015 | Coe-Sullivan et al. | |
| 9,136,428 B2 | 9/2015 | Clough et al. | |
| 9,139,435 B2 | 9/2015 | Breen et al. | |
| 2002/0106849 A1 | 8/2002 | Moore | |
| 2003/0145779 A1 * | 8/2003 | Alivisatos | C30B 7/00 117/2 |
| 2003/0227116 A1 | 12/2003 | Halik et al. | |
| 2004/0178390 A1 | 9/2004 | Whiteford et al. | |
| 2005/0129947 A1 | 6/2005 | Peng et al. | |
| 2006/0110279 A1 | 5/2006 | Han et al. | |
| 2007/0111324 A1 * | 5/2007 | Nie | A61K 47/48861 436/518 |
| 2007/0128439 A1 | 6/2007 | Kim et al. | |
| 2007/0201056 A1 | 8/2007 | Cok et al. | |
| 2007/0295266 A1 | 12/2007 | Lee et al. | |
| 2008/0012031 A1 | 1/2008 | Jang et al. | |
| 2008/0084706 A1 | 4/2008 | Roshan et al. | |
| 2008/0118755 A1 * | 5/2008 | Whiteford | C07F 5/025 428/403 |
| 2008/0188063 A1 | 8/2008 | Alivisatos et al. | |
| 2008/0220593 A1 | 9/2008 | Pickett et al. | |
| 2008/0264473 A1 | 10/2008 | Cumpston et al. | |
| 2008/0268248 A1 | 10/2008 | Jang et al. | |
| 2008/0277626 A1 * | 11/2008 | Yang | C09D 11/30 252/301.36 |
| 2008/0296144 A1 | 12/2008 | Strouse et al. | |
| 2008/0316576 A1 | 12/2008 | Molenkamp et al. | |
| 2009/0162011 A1 | 6/2009 | Coe-Sullivan et al. | |
| 2009/0203196 A1 | 8/2009 | Kim et al. | |
| 2009/0217970 A1 | 9/2009 | Zimmerman et al. | |
| 2009/0278141 A1 | 11/2009 | Coe-Sullivan et al. | |
| 2010/0009338 A1 | 1/2010 | Zhang et al. | |
| 2010/0052512 A1 | 3/2010 | Clough et al. | |
| 2010/0062154 A1 | 3/2010 | Shin et al. | |
| 2010/0108530 A1 | 5/2010 | Zehnder et al. | |
| 2010/0140586 A1 | 6/2010 | Char et al. | |
| 2010/0163800 A1 * | 7/2010 | Peng | B82Y 15/00 252/301.6 S |
| 2010/0226849 A1 | 9/2010 | Peng | |
| 2010/0258789 A1 | 10/2010 | Akai et al. | |
| 2010/0264371 A1 | 10/2010 | Nick | |
| 2010/0265307 A1 | 10/2010 | Linton et al. | |
| 2010/0283014 A1 | 11/2010 | Breen et al. | |
| 2010/0283036 A1 | 11/2010 | Coe-Sullivan et al. | |
| 2010/0283072 A1 | 11/2010 | Kazlas et al. | |
| 2010/0289003 A1 * | 11/2010 | Kahen | C09K 11/02 257/14 |
| 2010/0289044 A1 | 11/2010 | Krames et al. | |
| 2011/0006285 A1 | 1/2011 | Lifshitz et al. | |
| 2011/0031452 A1 | 2/2011 | Krauss et al. | |
| 2011/0052918 A1 * | 3/2011 | Krauss | B82Y 30/00 428/402 |
| 2011/0080090 A1 | 4/2011 | Wood et al. | |
| 2011/0081538 A1 | 4/2011 | Linton | |
| 2011/0103055 A1 | 5/2011 | Carroll | |
| 2011/0103064 A1 | 5/2011 | Coe-Sullivan et al. | |
| 2011/0129420 A1 | 6/2011 | Allen et al. | |
| 2011/0175030 A1 | 7/2011 | Ren et al. | |
| 2011/0186811 A1 | 8/2011 | Coe-Sullivan et al. | |
| 2011/0220194 A1 | 9/2011 | Kurtin et al. | |
| 2011/0220844 A1 | 9/2011 | Tulsky et al. | |
| 2011/0226991 A1 | 9/2011 | Treadway et al. | |
| 2011/0229397 A1 | 9/2011 | Bartel et al. | |
| 2011/0233468 A1 | 9/2011 | Zong et al. | |
| 2011/0245533 A1 | 10/2011 | Breen et al. | |
| 2011/0260111 A1 | 10/2011 | Nie et al. | |
| 2011/0309238 A1 | 12/2011 | Tian et al. | |
| 2011/0309325 A1 | 12/2011 | Park et al. | |
| 2012/0018675 A1 | 1/2012 | Okuyama et al. | |
| 2012/0049119 A1 | 3/2012 | Greytak et al. | |
| 2012/0113671 A1 | 5/2012 | Sadasivan et al. | |
| 2012/0187367 A1 | 7/2012 | Modi et al. | |
| 2012/0189791 A1 | 7/2012 | Modi et al. | |
| 2012/0250351 A1 | 10/2012 | Shin et al. | |
| 2012/0256141 A1 | 10/2012 | Nick et al. | |
| 2012/0286238 A1 | 11/2012 | Linton et al. | |
| 2012/0313075 A1 | 12/2012 | Linton et al. | |
| 2013/0069018 A1 | 3/2013 | Zhu et al. | |
| 2013/0169904 A1 | 7/2013 | Kang et al. | |
| 2013/0175514 A1 | 7/2013 | Han et al. | |
| 2013/0193407 A1 | 8/2013 | Clough et al. | |
| 2014/0049155 A1 | 2/2014 | Kurtin | |
| 2014/0198142 A1 | 7/2014 | Whitehead et al. | |
| 2014/0227862 A1 | 8/2014 | Song et al. | |
| 2014/0312300 A1 | 10/2014 | Ramprasad et al. | |
| 2014/0322901 A1 | 10/2014 | Huang et al. | |
| 2014/0334181 A1 | 11/2014 | Hu et al. | |
| 2015/0003043 A1 | 1/2015 | Ke | |
| 2015/0013589 A1 | 1/2015 | Liu et al. | |
| 2015/0014586 A1 | 1/2015 | Liu et al. | |
| 2015/0021548 A1 | 1/2015 | Liu et al. | |
| 2015/0021551 A1 | 1/2015 | Breen et al. | |
| 2015/0166341 A1 | 6/2015 | Hamilton et al. | |
| 2015/0171268 A1 | 6/2015 | Breen et al. | |
| 2015/0184074 A1 | 7/2015 | Breen et al. | |
| 2015/0191617 A1 | 7/2015 | Linton et al. | |

FOREIGN PATENT DOCUMENTS

| | | |
|---|---|---|
| WO | 2013078245 A1 | 5/2013 |
| WO | 2013078247 A1 | 5/2013 |
| WO | 2013078249 A1 | 5/2013 |
| WO | 2013115898 A2 | 8/2013 |
| WO | 2013162646 A1 | 10/2013 |

OTHER PUBLICATIONS

Cumberland et al., "Inorganic Clusters as Single-Source Presursors for Preparation of CdSe, ZnSe, and CdSe/ZnS Nanomaterials"; Chem. Mater.; 2002; 14; 1576-1584.

Dabbousi et al., "(CdSe)AnS Core-Shell Quantum Dots: Synthesis and Characterization of a Size Series of Highly Luminescent Nanocrystallites"; J. Phys. Chem. B.; 1997; 101; 9463-9475.

De Mello et al., "An Improved Experimental Determination of External Photoluminescence Quantum Efficiency"; Adv. Mater.; 1997; 9; No. 3; 230-232.

Donega et al., "Physicochemical Evaluation of the Hot-Injection Method, a Synthesis Route for Monodisperse Nanocrystals"; Small; 2005; 1; No. 12; 1152-1162.

Dukes, III et al., "Luminescent Quantum Dots"; ECS Transactions; 2011; 33 (33); 3-16.

Gong, "Synthesis, optical properties, and surface modification of magic-size semiconductor nanocrystals, nanowires and nanoplatelets"; San Diego State University 2011(http://sdsu-dspace.calstate.edu/handle/10211.10/1438); 49 pages.

Jang et al., "High quality CdSeS nanocrystals synthesized by facile single injection process and their electroluminescence"; ChemComm; 2003; 2964-2965.

(56) References Cited

OTHER PUBLICATIONS

Jing et al., "Temperature-Dependent Photoluminescence of CdSe-Core CdS/CdZnS/ZnS-Multishell Quantum Dots"; J. Phys. Chem. C.; 2009; 113; 13545-13550.

Koole et al., "Paramagnetic lipid-coated silica nanoparticles with a fluorescent quantum dot core: a new contrast agent platform for multimodality imaging"; Bioconj. Chem.; 2008; 19(12); 2471-2479.

LED's Magazine "Quantum dots begin to impact backlight and general illumination application"; ledsmagazine.com/news/7/2/12 (3 pages).

Murray et al., "Synthesis and Characterization of Monodisperse Nanocrystals and Close-Packed Nanocrystal Assemblies"; Annu. Rev. Mater. Sci.; 2000; 30; 545-610.

Murray et al., "Synthesis and Characterization of Nearly Monodisperse CdE (E= S, Se, Te) Semiconductor Nanocrystallites"; J. Am. Chem. Soc.; 1993; 115; 8706-8715.

Murray, "Synthesis and Characterization of II-VI Quantum Dots and Their Assembly into 3D Quantum Dot Superlattices"; Thesis; Massachusetts Institute of Technology; 1995 (166 pages).

Peng et al., "Kinetics of II-VI and III-V Colloidal Semiconductor Nanocrystal Growth: "Focusing" of Size Distributions"; J. Am. Chem. Soc.; 1998; 120; 5343-5344.

Peng et al., "Mechanisms of the Shape Evolution of CdSe Nanocrystals"; J. Am. Chem. Soc.; 2001; 123; 1389-1395.

Reiss et al., "The Growth of Uniform Colloidal Dispersion"; Journal of Chamical Physics; 1951; vol. 19; No. 4; 482-487.

Shen et al., "One-Step Synthesis of White-Light-Emitting Quantum Dots at Low Temperature"; Inorg. Chem.; 2009; 48; 8689-8694.

Written Opinion dated Feb. 8, 2013; International Application No. PCT/US12/66140; International Filing Date Nov. 20, 2012 (6 pages).

International Search Report dated Feb. 8, 2013; International Application No. PCT/US12/66140; International Filing Date Nov. 20, 2012 (2 pages).

\* cited by examiner

METHOD OF MAKING QUANTUM DOTS

This application is a continuation of International Application No. PCT/US2012/066140, filed 20 Nov. 2012, which was published in the English language as International Publication No. WO 2013/078245 on 30 May 2013, which International Application claims priority to U.S. Provisional Patent Application No. 61/562,459, filed on 22 Nov. 2011 and U.S. Provisional Patent Application No. 61/678,877, filed on 2 Aug. 2012. Each of the foregoing is hereby incorporated herein by reference in its entirety for all purposes.

TECHNICAL FIELD OF THE INVENTION

The present invention relates to the field of nanotechnology and more particularly to quantum dots and methods for preparing quantum dots.

BRIEF SUMMARY OF THE INVENTION

Embodiments of the present invention are directed to methods of making quantum dots (also referred to herein as semiconductor nanocrystals.) Quantum dots of certain size can be made according to a reaction process described herein which is terminated or quenched before Ostwald ripening or broadening of the size distribution of the semiconductor particles occurs. In certain embodiments, quantum dot precursors for making the quantum dots are added in a controlled manner. Aspects of addition that can be controlled include, but are not limited to, rate of addition, size or amount of each addition, order of addition (e.g., sequential, alternating, etc.). In certain embodiments, quantum dot precursors are added in a continuous manner. The size of the quantum dots or core particles so formed may be further increased to a certain size by the reaction of additional amounts of quantum dot precursors on an outer surface of the quantum dots or core particles. In certain embodiments, additional quantum dot precursors are added in a controlled manner. Aspects of addition that can be controlled include, but are not limited to, rate of addition, size or amount of each addition, order of addition (e.g., sequential, alternating, etc.). In certain embodiments, additional quantum dot precursors are added in a continuous manner According to one embodiment, the quantum dots may be isolated from media and then subjected to conditions to facilitate further growth of the particles to, for example, obtain a quantum dot having a desired size and/or a quantum dot with a desired peak emission wavelength. According to an additional embodiment, the quantum dots are produced by separate nucleation and growth steps. According to a still further embodiment, the quantum dots produced by the methods of the present invention may further be provided with a coating or shell or layer. According to an additional embodiment, the quantum dots produced by the methods described herein by separate nucleation and growth steps need not be purified prior to being provided with a coating or layer or shell. According to an additional embodiment, the quantum dots produced by the methods described herein by separate nucleation and growth steps are created using a quantitative method and need not be purified prior to being provided with a coating or layer or shell.

According to certain aspects of the present disclosure, core quantum dots may be formed from quantum dot precursors. For example, quantum dots comprising a semiconductor material that can be represented by the formula MX, wherein M represents one or more metals and X represents one or more chalcogens and/or one or more pnictogens, can be formed from quantum dot precursors comprising one or more M donors and one or more X donors. According to certain aspects, an X donor and M donor are combined at a reaction temperature to form a reaction mixture. The reaction is then terminated or quenched. In certain aspects, an X donor can be added to a solution of a metal source or M donor at a reaction temperature to form a reaction mixture. The reaction is then terminated or quenched. In certain aspects, an M donor can be added to a solution of an X donor at a reaction temperature to form a reaction mixture. The reaction is then terminated or quenched. In certain aspects, an M donor and an X donor can be added to reaction medium simultaneously. According to one aspect, the reaction is terminated or quenched so as to stop growth of the quantum dots before the quantum dots ripen or broaden or combine together. According to one aspect, the reaction is terminated or quenched by cooling the reaction mixture to a quenching temperature effective to terminate or quench the nucleation process in a manner to stop or limit further growth of the semiconductor nanocrystals. According to an additional aspect, the reaction mixture is cooled to a temperature effective to quench or stop growth of the semiconductor nanocrystals formed in the reaction mixture prior to ripening or broadening or combining of the quantum dots. Quantum dots are present in the reaction vessel and may be isolated or recovered. The quantum dots in the reaction vessel or the quantum dots after isolation or recovery may be subjected to further growth by exposure to an M donor and an X donor. According to this aspect, the quantum dots are exposed to an M donor and an X donor under suitable reaction conditions such that the quantum dots grow in size using the M donor and X donor. According to one aspect, the M donor and the X donor are provided to a reaction vessel including the quantum dots as a substantially steady or substantially constant infusion or feed or source such that as the M donor and the X donor are consumed or otherwise used to grow the quantum dots, additional supply of M donor and X donor are provided to the reaction vessel, such as in a substantially continuous manner, to continue growth of the quantum dots until a desired quantum dot size is reached.

According to a certain aspect, an M donor and an X donor are combined at a reaction temperature to form quantum dots in a reaction mixture. The reaction is terminated resulting in nanocrystals of certain size. In certain aspects, a solution of an M donor is provided at a reaction temperature, such as by heating, after which an X donor is rapidly added to the solution of the metal source whereupon nanocrystals including the M component of the M donor and the X component of the X donor form in a reaction mixture. The reaction is terminated resulting in nanocrystals of certain size. In certain aspects, an M donor can be added to a solution of an X donor at a reaction temperature to form a reaction mixture. The reaction is then terminated or quenched. In certain aspects, an M donor and an X donor can be added to a reaction medium simultaneously. According to one aspect, the reaction is terminated according to methods known to those of skill in the art which may include termination by use of a chemical agent, termination by use of a temperature reduction, termination by use of isolation material or dilution of reactive ingredients to a point where the reactive ingredients are no longer effectively reactive. According to one aspect, the reaction is terminated by rapidly cooling the reaction mixture to a quenching temperature substantially below that of the reaction temperature. It is to be understood that different reaction temperatures may exist for different reaction mixtures. Likewise, it is to be understood that different quenching temperatures may exist for different reaction mixtures. Accordingly, reaction temperatures include those at which quantum dots may be created and quenching temperatures include those at which the nucleation process is terminated or quenched resulting in quantum dots of desired size. Quantum dots are then present in the reaction vessel and then may be isolated or recovered. According to one aspect, M donors and X donors are provided to a reaction vessel including the quantum dots as a substantially steady or substantially constant infusion or feed or source such that as M donor and X donor are consumed or otherwise used to grow the quantum dots, additional supply of M donor and X donor are provided to the reaction vessel, such as in a substantially continuous manner, to continue growth of the quantum dots until a desired quantum dot size is reached.

According to a certain aspect, a solution of a first quantum dot precursor (e.g., M donor or X donor) is provided at a reaction temperature, such as by heating, after which a second quantum dot precursor (the X donor or M donor that complements the first quantum dot precursor to make the desired quantum dot) is rapidly added, such as by injection, into the solution of the first quantum dot precursor to form a reaction mixture whereupon the M component from the M donor and the X component from the X donor combine to nucleate. Immediately after addition of the second quantum dot precursor is completed, the reaction mixture is rapidly cooled to a quenching temperature thereby terminating or quenching the growth of nanocrystals. According to a certain aspect, the reaction, i.e. growth of nanocrystals, is terminated thereby resulting in nanocrystals of certain size by quenching methods known to those of skill in the art. According to one aspect, the reaction is terminated by rapidly cooling the reaction mixture to a temperature substantially below that of the reaction temperature. Quantum dots are then present in the reaction vessel and then may be isolated or recovered. According to one aspect, M donors and X donors are provided to a reaction vessel including the quantum dots as a substantially steady or substantially constant infusion or feed or source such that as M donor and X donor are consumed or otherwise used to grow the quantum dots, additional supply of M donor and X donor are provided to the reaction vessel, such as in a substantially continuous manner, to continue growth of the quantum dots until a desired quantum dot size is reached.

According to a certain aspect, quantum dots of certain desired size are created by selecting a certain initial reaction temperature of a solution of an M donor followed by rapid addition, such as by injection, of an X donor to produce a reaction mixture. Immediately after completion of the rapid addition of the X donor, the reaction mixture is rapidly cooled to quenching temperature to stop or otherwise inhibit further nanocrystal growth. According to this aspect, a higher initial reaction temperature will produce quantum dots of larger diameter compared to a lower initial reaction temperature. In this manner, a method is provided of tuning quantum dot size by selecting an initial reaction temperature which is rapidly lowered to a quenching temperature. In certain embodiments, the M donor can alternatively be added to the X donor. Without wishing to be bound by scientific theory, the higher the initial reaction temperature, the longer the reaction mixture is allowed to react, and accordingly, the longer the particles are allowed to grow before reaching a temperature at which the reaction is substantially or effectively terminated. Once the reaction is terminated, the quantum dots produced may then be contacted with M donors and X donors provided to a reaction vessel including the quantum dots as a substantially steady or substantially constant infusion or feed or source such that as M donor and X donor are consumed or otherwise used to grow the quantum dots, additional supply of M donor and X donor are provided to the reaction vessel, such as in a substantially continuous manner, to continue growth of the quantum dots until a desired quantum dot size is reached.

According to certain aspects of the present disclosure, a secondary phosphine chalcogenide or secondary phosphine chalcogenide precursor or oxygen-treated tertiary phosphine is added to a solution of a metal source at a reaction temperature to form a reaction mixture. In certain embodiments, the secondary phosphine chalcogenide precursor comprises at least 10% secondary phosphine chalcogenide by weight, e.g., at least 20% secondary phosphine chalcogenide by weight, at least 30% secondary phosphine chalcogenide by weight, at least 40% secondary phosphine chalcogenide by weight, at least 50% secondary phosphine chalcogenide by weight, at least 60% secondary phosphine chalcogenide by weight, at least 70% secondary phosphine chalcogenide by weight, at least 80% secondary phosphine chalcogenide by weight, at least 90% secondary phosphine chalcogenide by weight, up to 100% secondary phosphine chalcogenide by weight. The reaction is then terminated or quenched. According to one aspect, the reaction is terminated or quenched so as to stop growth of the quantum dots before the quantum dots Ostwald ripen or the size distribution broadens or the quantum dots combine together in an undesirable manner. According to one aspect, termination of the reaction comprises cooling the reaction mixture to a quenching temperature effective to terminate or quench the reaction process in a manner to stop or limit further growth of the semiconductor nanocrystals. In an additional aspect, the reaction mixture is cooled to a temperature effective to quench or stop growth of the semiconductor nanocrystals formed in the reaction mixture prior to Ostwald ripening which results in particle size distribution broadening. Quantum dots are present in the reaction vessel and may be isolated or recovered. The quantum dots in the reaction vessel or the quantum dots after isolation or recovery may be subjected to further growth by exposure to metal and chalcogenide precursors such as a secondary phosphine chalcogenide or secondary phosphine chalcogenide precursor or oxygen-treated tertiary phosphine. According to this aspect, the quantum dots are exposed to metal and chalcogenide precursors under suitable reaction conditions such that the size of the quantum dots is grown by reaction of the metal and chalcogenide on the quantum dots. According to one aspect, metal and chalcogenide precursors or reactants are provided to a reaction vessel including the quantum dots as a substantially steady or substantially constant infusion or feed or source such that as metal and chalcogenide precursors are consumed or otherwise used to grow the quantum dots, additional supply of metal and chalcogenide precursors are provided to the reaction vessel, such as in a substantially continuous manner, to continue growth of the quantum dots until a desired quantum dot size is reached.

In the present invention described herein, an oxygen-treated tertiary phosphine chalcogenide can comprise liquid tertiary phosphine chalcogenide that is exposed to air or other gas including oxygen. Exposure can include, for example, bubbling air or other oxygen containing gas into the liquid tertiary phosphine chalcogenide, flowing air or other oxygen containing gas over the surface of the liquid, or other techniques readily ascertained by the skilled artisan. Preferably the air or other gas including oxygen to which the liquid tertiary phosphine chalcogenide is exposed is dry. In certain embodiments, such exposure is carried out at room temperature, e.g., without the application of heat. The addition of air or other gas including oxygen is carried out to convert at least a portion of the tertiary phosphine chalcogenide to a secondary phosphine chalcogenide. The addition of air or other gas including oxygen, however, should be stopped before all the secondary phosphine formed is converted into other chemical species. Examples of tertiary phosphines include, but are not limited to, trialkyl phosphines such as tri-n-octylphosphine, tri-n-butylphosphine, and tri-aryl phosphines.

According to a certain aspect, a solution of a metal source is provided at a reaction temperature, such as by heating, after which a secondary phosphine chalcogenide or secondary phosphine chalcogenide precursor or oxygen-treated tertiary phosphine chalcogenide is rapidly added to the solution of the metal source whereupon nanocrystals including the metal and the chalcogenide form in a reaction mixture. The reaction is terminated resulting in nanocrystals of certain size. In certain embodiments, the metal source can alternatively be added to the secondary phosphine chalcogenide or secondary phosphine chalcogenide precursor or oxygen-treated tertiary phosphine chalcogenide. According to one aspect, the reaction is terminated according to methods known to those of skill in the art which may include termination by use of a chemical agent, termination by use of a temperature reduction, termination by use of isolation material or dilution of reactive ingredients to a point where the reactive ingredients are no longer effectively reactive. According to one aspect, the reaction is terminated by rapidly cooling the reaction mixture to a quenching temperature substantially below that of the reaction temperature. It is to be understood that different reaction temperatures may exist for different reaction mixtures. Likewise, it is to be understood that different quenching temperatures may exist for different reaction mixtures. Accordingly, reaction temperatures include those at which quantum dots may be created and quenching temperatures include those at which the quantum dot growing process is terminated or quenched resulting in quantum dots of desired size. Other techniques may be determined by the skilled artisan to be useful or desirable for terminating or quenching the reaction. Quantum dots present in the reaction vessel then may be isolated or recovered. According to one aspect, metal and chalcogenide precursors or reactants such as secondary phosphine chalcogenide or secondary phosphine chalcogenide precursor or oxygen-treated tertiary phosphine are provided to a reaction vessel including the quantum dots as a substantially steady or substantially constant infusion or feed or source such that as metal and chalcogenide precursors are consumed or otherwise used to grow the quantum dots, additional supply of metal and chalcogenide precursors are provided to the reaction vessel, such as in a substantially continuous manner, to continue growth of the quantum dots until a desired quantum dot size is reached.

According to a certain aspect, a solution of a metal source is provided at a reaction temperature, such as by heating, after which a secondary phosphine chalcogenide or secondary phosphine chalcogenide precursor or oxygen-treated tertiary phosphine is rapidly added, such as by injection, into the solution of the metal source to form a reaction mixture whereupon the metal and the chalcogenide combine to form nanocrystals. Immediately after addition of the secondary phosphine chalcogenide is completed, the reaction mixture is rapidly cooled to a quenching temperature thereby terminating or quenching the growth of nanocrystals. According to certain aspect, the reaction, i.e. formation of nanocrystals, is terminated thereby resulting in nanocrystals of certain size by quenching methods known to those of skill in the art. In certain embodiments, the metal source can alternatively be added to the secondary phosphine chalcogenide or secondary phosphine chalcogenide precursor or oxygen-treated tertiary phosphine chalcogenide. According to one aspect, the reaction is terminated by rapidly cooling the reaction mixture to a temperature substantially below that of the reaction temperature. Quantum dots are then present in the reaction vessel and then may be isolated or recovered. According to one aspect, metal and chalcogenide precursors or reactants such as secondary phosphine chalcogenide or secondary phosphine chalcogenide precursor or oxygen-treated tertiary phosphine are provided to a reaction vessel including the quantum dots as a substantially steady or substantially constant infusion or feed or source such that as metal and chalcogenide precursors are consumed or otherwise used to grow the quantum dots, additional supply of metal and chalcogenide precursors are provided to the reaction vessel, such as in a substantially continuous manner, to continue growth of the quantum dots until a desired quantum dot size is reached.

According to a certain aspect, quantum dots of certain desired size are created by selecting a certain initial reaction temperature of a solution of a metal source, followed by rapid addition, such as by injection, of a secondary phosphine chalcogenide or secondary phosphine chalcogenide precursor or oxygen-treated tertiary phosphine to produce a reaction mixture. Immediately after completion of the rapid addition of the secondary phosphine chalcogenide or secondary phosphine chalcogenide precursor or oxygen-treated tertiary phosphine, the reaction mixture is rapidly cooled to quenching temperature to stop or otherwise inhibit further nanocrystal growth. According to this aspect, a higher initial reaction temperature will produce quantum dots of larger diameter compared to a lower initial reaction temperature. In this manner, a method is provided of tuning quantum dot size by selecting an initial reaction temperature which is rapidly lowered to a quenching temperature. In certain embodiments, the metal source can alternatively be added to the secondary phosphine chalcogenide or secondary phosphine chalcogenide precursor or oxygen-treated tertiary phosphine chalcogenide. Without wishing to be bound by scientific theory, the higher the initial reaction temperature, the longer the reaction mixture is allowed to react, and accordingly, the longer the particles are allowed to grow before reaching a temperature at which the reaction is substantially or effectively terminated. Once the reaction is terminated, the quantum dots produced may then be contacted with metal and chalcogenide precursors or reactants such as secondary phosphine chalcogenide or secondary phosphine chalcogenide precursor or oxygen-treated tertiary phosphine chalcogenide provided to a reaction vessel including the quantum dots as a substantially steady or substantially constant infusion or feed or source such that metal and chalcogenide precursors are consumed or otherwise used to grow the quantum dots until a desired quantum dot size is reached.

According to certain aspects, a secondary phosphine chalcogenide may be provided to the reaction mixture as a secondary phosphine chalcogenide or as a precursor to a secondary phosphine chalcogenide or as oxygen treated tertiary phosphine chalcogenide. Suitable precursor compounds include tertiary phosphine chalcogenides which may be oxidized in the reaction mixture to produce secondary phosphine chalcogenides for use in the process of making quantum dots. Alternatively, tertiary phosphine chalcogenides may be oxidized prior to addition to a reaction mixture to produce secondary phosphine chalcogenides for use in the process of making quantum dots.

According to certain aspects, quantum dots may be made according to the present invention in the absence of amine compounds in the reaction mixture. According to this aspect, a reaction mixture is substantially free of amine compounds or substantially excludes amine compounds.

According to certain aspects, quantum dots may be made according to the invention described herein with ligands attached to the surface of the quantum dots. According to this aspect, ligand-providing compounds can be included into the reaction mixture used to produce the quantum dots. Such ligand-providing compounds include carboxylates, phosphonates, phosphonites and the like.

According to a certain aspect, quantum dots produced by the methods described herein can then be coated with one or more coatings including semiconductor materials. A coating layer can comprise one or more inorganic materials. A coating layer can comprise one or more semiconductor materials. A coating layer can comprise one or more different semiconductor materials. A coating layer can comprise more than one layer. When multiple layers are included on the semiconductor nanocrystals, each layer can have a composition that is the same or different from that of an adjacent layer. When multiple layers are included on the semiconductor nanocrystals, each layer can have a composition that is the same or different from that of any other layer.

In accordance with a certain aspect of the present invention, a method is provided for increasing the yield of quantum dots using the invention described herein. For example, the method includes providing a solution including a predetermined metal source at a reaction temperature and to which a predetermined chalcogen or pnictogen source is rapidly added to the solution of the metal source whereupon nanocrystals including the predetermined metal(s) and chalcogen(s) or pnictogen(s) form in a reaction mixture. The reaction is terminated resulting in nanocrystals of certain size. In certain embodiments a metal source can include more than one metal source and a chalcogen or pnictogen source can include more than one chalcogen or pnictogen source, depending on the predetermined composition of the nanocrystal being made. In alternative embodiments, the chalcogen or pnictogen source(s) can be added to the metal source(s) or they can be combined simultaneously or in an alternating manner. The nanocrystals may then be subjected to further growth conditions as described herein to result in a quantum dot of desired size.

Each of the original claims set forth at the end of the present application are hereby incorporated into this Summary section by reference in its entirety.

The foregoing, and other aspects and embodiments described herein all constitute embodiments of the present invention.

It should be appreciated by those persons having ordinary skill in the art(s) to which the present invention relates that any of the features described herein in respect of any particular aspect and/or embodiment of the present invention can be combined with one or more of any of the other features of any other aspects and/or embodiments of the present invention described herein, with modifications as appropriate to ensure compatibility of the combinations. Such combinations are considered to be part of the present invention contemplated by this disclosure.

It is to be understood that both the foregoing general description and the following detailed description are exemplary and explanatory only and are not restrictive of the invention as claimed. Other embodiments will be apparent to those skilled in the art from consideration of the specification and practice of the invention disclosed herein.

Figure 1:
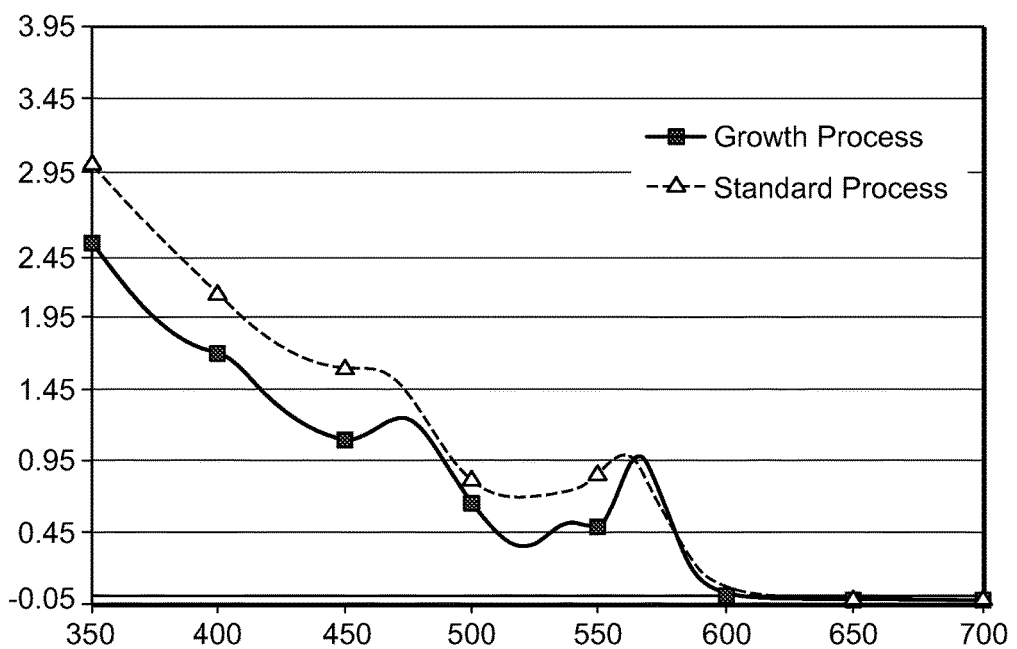
FIG. 1 is an absorbance spectrum comparing quantum dots made by methods disclosed herein and quantum dots made by a standard process of nucleation and growth in a closed system without quenching or continuous introduction of reactants.

The attached figure is a simplified representation presented for purposes of illustration only.

For a better understanding of the present invention, together with other advantages and capabilities thereof, reference is made to the following disclosure and appended claims in connection with the above-described drawings.

DETAILED DESCRIPTION OF THE INVENTION

Embodiments of the present disclosure are directed to methods of making quantum dots ("QDs"). Quantum dots or nanocrystals are nanometer sized semiconductor particles that can have optical properties arising from quantum confinement. Quantum dots can have various shapes, including, but not limited to, a sphere, a rod, a disk, other shapes, and mixtures of various shaped particles. The particular composition(s), structure, and/or size of a quantum dot can be selected to achieve the desired wavelength of light to be emitted from the quantum dot upon stimulation with a particular excitation source. In essence, quantum dots may be tuned to emit light across the visible spectrum by changing their size. See C. B. Murray, C. R. Kagan, and M. G. Bawendi, *Annual Review of Material Sci.*, 2000, 30: 545-610 hereby incorporated by reference in its entirety. The narrow FWHM of quantum dots can result in saturated color emission. In certain embodiments, FWHM can be, for example, less than 60, less than 50, less than 40, or less than 30. The broadly tunable, saturated color emission over the entire visible spectrum of a single material system is unmatched by any class of organic chromophores (see, for example, Dabbousi et al., *J. Phys. Chem.* 101, 9463 (1997), which is incorporated by reference in its entirety). A monodisperse population of quantum dots will emit light spanning a narrow range of wavelengths.

According to exemplary embodiments, quantum dots of a certain size are formed in a first step by combining an M donor in a liquid medium at a reaction temperature with an X donor to form a reaction mixture producing quantum dots including the M component from the M donor and the X component from the X donor. After the M component and the X component are combined to create quantum dots of desired size, the reaction is terminated or quenched, such as by cooling the reaction mixture to a quenching temperature at which the reaction substantially terminates and the particles precipitate out of solution and may be collected or isolated.

According to one aspect, a method for making quantum dots is provided by combining an X donor with a source of a metal in a liquid medium at a reaction temperature to form a reaction mixture; quenching the reaction mixture to arrest nucleation, growth and ripening thereby resulting in quantum dots; and combining the quantum dots with an additional X donor and an additional source of metal under conditions suitable to increase the size of the quantum dots. According to one aspect, the X donor includes oxygen, sulfur, selenium, tellurium, nitrogen, phosphorus, arsenic, and/or antimony. According to one aspect, the metal is cadmium, zinc, magnesium, mercury, aluminum, gallium, indium, thallium, lead and/or germanium. According to one aspect, the step of quenching includes rapidly cooling the reaction mixture immediately upon completion of combining the X donor with the source of a metal. According to one aspect, the step of quenching includes rapidly cooling the reaction mixture immediately upon completion of combining the X donor with the source of the metal and prior to ripening. According to one aspect, the X donor and the source of metal are highly reactive.

According to exemplary embodiments, quantum dots of a certain size are formed by combining a metal source or donor in a liquid medium at a reaction temperature with a secondary phosphine chalcogenide or secondary phosphine chalcogenide precursor compound or oxygen-treated tertiary phosphine chalcogenide to form a reaction mixture producing quantum dots including the metal source and the chalcogenide. After the metal source and the secondary phosphine chalcogenide or secondary phosphine chalcogenide precursor compound or oxygen-treated tertiary phosphine chalcogenide are combined to create quantum dots of desired size, the reaction is terminated or quenched, such as by cooling the reaction mixture to a quenching temperature at which the reaction substantially terminates and the quantum dots precipitate out of solution and may be collected or isolated. In certain embodiments, a metal source can comprise one or more metal sources which can be the same or different. In certain embodiments, a chalcogenide source can comprise one or more chalcogenide sources which can be the same or different.

A reaction temperature is preferably sufficient for reacting one or more metal sources and one or more chalcogen sources to form a semiconductor material comprising one or more metals and one or more chalcogens.

According to aspects of the present disclosure, an exemplary reaction temperature is between about 125° C. and about 400° C., between about 150° C. and about 350° C., between about 175° C. and about 325° C., between about 200° C. and about 300° C., above about 150° C., above about 175° C., above about 200° C., above about 225° C., above about 250° C., above about 260° C., above about 270° C., above about 275° C., above about 280° C., above about 290° C., above about 300° C., above about 310° C., above about 320° C., and the like.

In certain embodiments, a quenching temperature is selected to be sufficient to slow, and preferably stop, further reaction of one or more metal sources and one or more chalcogen sources.

An exemplary quenching temperature at which the reaction produces quantum dots is about 200° C. or below about 200° C. According to certain aspects of the present disclosure, a quenching temperature is substantially lower than a reaction temperature. An exemplary quenching temperature is between about 50° C. and about 150° C. lower than a given reaction temperature, between about 75° C. and about 125° C. lower than a given reaction temperature, or about 100° C. lower than a given reaction temperature. An exemplary quenching temperature is between about 175° C. and about 75° C., between about 150° C. and about 100° C., between about 125° C. and about 100° C., lower than about 150° C., lower than about 125° C., lower than about 100° C. and the like. An exemplary quenching temperature at which the reaction substantially terminates but the quantum dots precipitate out of solution is about 100° C. or below about 100° C. The quantum dots are then isolated or recovered or purified prior to further processing.

In a second step, the quantum dots can be then increased in size or "grown" when the quantum dots are combined with an M donor and an X donor under conditions where the M component of the M donor and the X component of the X donor combine with the quantum dots to create a larger quantum dot over time. Accordingly, exemplary methods described herein may have a first core-producing step and a second growth step to produce quantum dots of a given size.

In accordance with one aspect, the ratio of moles of chalcogen or pnictogen to moles of metal in the reaction mixture is greater than or equal to one. According to an additional aspect, the quantum dots which have been isolated or recovered or purified are then increased in size or "grown" when the quantum dots are combined with a metal source or donor and a chalcogen or pnictogen source or donor under conditions where the metal and the chalcogenide combine with the quantum dots to create a larger quantum dot over time. Accordingly, exemplary methods described herein may have a first core-producing step and a second growth step to produce quantum dots of a given size.

According to an exemplary embodiment including a metal precursor comprising cadmium and a chalcogen source (e.g., including but not limited to, a secondary phosphine chalcogenide or secondary phosphine chalcogenide precursor or oxygen-treated tertiary phosphine chalcogenide) comprising selenium, the precursors or sources are selected such that upon their combination in a liquid medium at a temperature of above about 200° C., the metal precursor and the chalcogen source react to form quantum dots including the metal and chalcogen having a peak absorbance between about 420 nm and about 480 nm. According to one aspect, the quantum dots of peak absorbance between about 420 nm and about 480 nm are formed rapidly upon combination of the metal precursor and the chalcogen source in the reaction vessel. According to one aspect, the metal precursor is in a reaction vessel in a liquid medium at a temperature of above about 200° C. The chalcogen source is rapidly added to the reaction vessel and the liquid medium whereupon quantum dots including the metal and the chalcogen of peak absorbance between about 420 nm and about 480 nm are formed upon the rapid addition of the chalcogen source. After rapid addition of the chalcogen source is completed, the reaction vessel is immediately cooled to a temperature of about 100° C. or below so as to substantially terminate the reaction.

Exemplary quantum dots according to the present disclosure include those having metal from the metal precursors and chalcogen from, for example, including but not limited to, a secondary phosphine chalcogenide or secondary phosphine chalcogenide precursor compound or oxygen-treated tertiary phosphine chalcogenide. Accordingly, exemplary quantum dots include those of the formula MX, where M is a metal from a metal donor and X is a compound from an X donor which is capable of reacting with the metal donor to form a material with the general formula MX. In certain embodiments, the M donor and the X donor can be moieties within the same molecule.

The M donor or metal precursor can be an inorganic compound, an organometallic compound, or elemental metal.

Metal precursor can constitute a wide range of substances, such as a metal oxide, a metal carbonate, a metal bicarbonate, a metal sulfate, a metal sulfite, a metal phosphate, metal phosphite, a metal halide, a metal carboxylate, a metal alkoxide, a metal thiolate, a metal amide, a metal imide, a metal alkyl, a metal aryl, a metal coordination complex, a metal solvate, a metal salt, and the like.

Examples of metals include cadmium, zinc, magnesium, mercury, aluminum, gallium, indium, thallium, or mixtures. Other metals that can react to form a semiconductor comprising a metal chalcogenide can also be used.

Exemplary metal precursors include dimethylcadmium and cadmium oleate. For example, an M donor or metal precursor can comprise cadmium, zinc, magnesium, mercury, aluminum, gallium, indium, thallium, lead, germanium or mixtures thereof.

The X donor can comprise a chalcogen or chalcogenide donor where X can comprise oxygen, sulfur, selenium, or tellurium, or mixtures thereof. Suitable chalcogenide donors include reactive chalcogenide source, such as highly reactive chalcogenide sources such as $(TMS)_2Se$, $(TMS)_2S$, $H_2S$, chalcogenide mixtures such as octadecene-Se, (ODE/Se), octadecene-S (ODE/s), amine-Se, amine-S, oxygen-treated tertiary phosphine chalcogenide and mixtures thereof and secondary phosphine chalcogenides include a secondary phosphine sulfide, a secondary phosphine selenide, a secondary phosphine telluride, or a secondary phosphine oxide, dialkyl phosphine chalcogenides such as diisobutylphosphine selenides, diisobutylphosphine sulfides, diphenylphosphine selenides, diphenylphosphine sulfides or mixtures thereof or mixtures of any of the above.

Additional X components can comprise a pnictogen or pnictide donor where X can comprise nitrogen, phosphorus, arsenic, antimony or mixtures thereof. The X donor can comprise a compound capable of reacting with the M donor to form a material with the general formula MX.

As discussed above, an X donor can comprise a chalcogenide donor or a pnictide donor, such as a phosphine chalcogenide, a bis(silyl) chalcogenide, dioxygen, an ammonium salt, or a tris(silyl) pnictide. Suitable X donors include, for example, but are not limited to, dioxygen, bis(trimethylsilyl) selenide $((TMS)_2Se)$, trialkyl phosphine selenides such as (tri-noctylphosphine) selenide (TOPSe) or (tri-n-butylphosphine) selenide (TBPSe), trialkyl phosphine tellurides such as (tri-n-octylphosphine) telluride (TOPTe) or hexapropylphosphorustriamide telluride (HPPTTe), bis(t-rimethylsilyl)telluride $((TMS)_2Te)$, bis(trimethylsilyl)sulfide $((TMS)_2S)$, a trialkyl phosphine sulfide such as (tri-noctylphosphine) sulfide (TOPS), an ammonium salt such as an ammonium halide (e.g., $NH_4Cl$), tris(trimethylsilyl) phosphide $((TMS)_3P)$, tris(trimethylsilyl) arsenide $((TMS)_3As)$, or tris(trimethylsilyl) antimonide $((TMS)_3Sb)$. In certain embodiments, the M donor and the X donor can be moieties within the same molecule.

Examples of materials suitable for use as quantum dot cores include, but are not limited to, ZnO, ZnS, ZnSe, ZnTe, CdO, CdS, CdSe, CdTe, MgS, MgSe, GaAs, GaN, GaP, GaSe, GaSb, HgO, HgS, HgSe, HgTe, InAs, InN, InP, AlAs, AlN, AlP, AlSb, TlN, TlP, TlAs, TlSb, PbO, PbS, PbSe, PbTe, Ge, Si, an alloy including any of the foregoing, and/or a mixture including any of the foregoing, including ternary and quaternary mixtures or alloys.

Examples of materials suitable for use as quantum dot cores include, but are not limited to, ZnO, ZnS, ZnSe, ZnTe, CdO, CdS, CdSe, CdTe, MgS, MgSe, GaSe, HgO, HgS, HgSe, HgTe, PbO, PbS, PbSe, PbTe, an alloy including any of the foregoing, and/or a mixture including any of the foregoing, including ternary and quaternary mixtures or alloys.

A semiconductor nanocrystal (including a semiconductor nanocrystal core of a core/shell semiconductor nanocrsytal) can comprise one or more semiconductor materials at least one of which comprises at least one metal and at least one chalcogen. Examples of semiconductor materials include, but are not limited to, Group II-VI compounds (e.g., binary, ternary, and quaternary compositions), Group III-VI compounds (e.g., binary, ternary, and quaternary compositions), Group IV-VI compounds (e.g., binary, ternary, and quaternary compositions), Group compounds (e.g., binary, ternary, and quaternary compositions), Group II-IV-VI compounds (e.g., binary, ternary, and quaternary compositions), and alloys including any of the foregoing, and/or a mixture including any of the foregoing. Semiconductor nanocrystals can also comprise one or more semiconductor materials that comprise ternary and quaternary alloys that include one or more of the foregoing compounds, Examples of Group II elements include Zn, Cd, and Hg. Examples of Group VI elements include oxygen, sulfur, selenium and tellurium. Examples of Group III elements include boron, aluminum, gallium, indium, and thallium. Examples of Group V elements include nitrogen, phosphorus, arsenic antimony, and bismuth. Examples of Group IV elements include silicon, germanium, tin, and lead.

As discussed herein, a semiconductor nanocrystal on which a coating is grown in accordance with the present invention can comprise one or more coatings or shells over a surface of the core. A shell typically comprises a semiconductor material. A shell can comprise a Group II-VI compound, Group II-V compound, Group III-VI compound, Group III-V compound, Group IV-VI compound, Group I-III-VI compound, Group II-IV-VI compound, and Group II-IV-V compound. Non-limiting examples of such semiconductor materials include, but are not limited to, ZnS, ZnSe, ZnTe, CdS, CdSe, CdTe, HgS, HgSe, HgTe, AlN, AlP, AlAs, AlSb, GaN, GaP, GaAs, GaSb, GaSe, InN, InP, InAs, InSb, TlN, TlP, TlAs, TlSb, PbS, PbSe, PbTe, a mixture including any one or more of the foregoing, an alloy including any one or more of the foregoing, etc. In certain embodiments, a shell can comprise a Group IV element.

According to an exemplary embodiment, the liquid medium includes solvents such as coordinating solvents. Alternatively, non-coordinating solvents can also be used in certain applications. A coordinating solvent is a compound having a donor lone pair, for example, a lone electron pair available to coordinate to a surface of the growing quantum dot (including, e.g., a semiconductor nanocrystal). Solvent coordination can stabilize the growing quantum dot. Examples of coordinating solvents include alkyl phosphines, alkyl phosphine oxides, alkyl phosphonic acids, or alkyl phosphinic acids, however, other coordinating solvents, such as pyridines, furans, and amines may also be suitable for the quantum dot (e.g., semiconductor nanocrystal) production. Additional examples of suitable coordinating solvents include pyridine, tri-n-octyl phosphine (TOP), tri-n-octyl phosphine oxide (TOPO) and trishydroxylpropylphosphine (tHPP), tributylphosphine, tri (dodecyl)phosphine, dibutyl-phosphite, tributyl phosphite, trioctadecyl phosphite, trilauryl phosphite, tris(tridecyl) phosphite, triisodecyl phosphite, bis(2-ethylhexyl)phosphate, tris(tridecyl) phosphate, hexadecylamine, oleylamine, octadecylamine, bis(2-ethylhexyl)amine, octylamine, dioctylamine, trioctylamine, dodecylamine/laurylamine, didodecylamine tridodecylamine, hexadecylamine, diocta-decylamine, trioctadecylamine, phenylphosphonic acid, hexylphosphonic acid, tetradecylphosphonic acid, octylphosphonic acid, octadecylphosphonic acid, propylenediphosphonic acid, phenylphosphonic acid, aminohexylphosphonic acid, dioctyl ether, diphenyl ether, methyl myristate, octyl octanoate, N-dodecylpyrrolidone (NDP), and hexyl octanoate. In certain embodiments, technical grade TOPO can be used.

According to one aspect, the solvent is at a reaction temperature of above about 200° C. According to an additional aspect the solvent is at a reaction temperature of between about 200° C. and 400° C. According to one aspect, the metal precursor and the secondary phosphine chalcogenide or secondary phosphine chalcogenide precursor compound or oxygen-treated tertiary phosphine chalcogenide are introduced into a reaction vessel and the solvent at substantially the same time. Alternatively, the metal precursor is in the solvent in the reaction vessel and the chalcogenide is added to the solvent in the reaction vessel.

According to one aspect, the M component from the M donor and the X component from the X donor, for example the metal and the chalcogen species react together in a colloidal growth process to produce quantum dots. According to an exemplary aspect, the X donor, for example, a chalcogenide is added to the solvent by injection. For a given volume of secondary phosphine chalcogenide or secondary phosphine chalcogenide precursor or oxygen-treated tertiary phosphine chalcogenide, rapid addition such as by injection includes an addition accomplished in between about 0.5 seconds and about 60 seconds, between about 5 seconds and about 50 seconds, between about 10 seconds and about 30 seconds, between about 1 second to about 3 seconds, between about 1 second to about 2 seconds and the like.

Rapid injection methods and devices are known to those of ordinary skill in the art and include manual injection such as by syringe or automated injection such as by pneumatic pressure operating on a container or vessel including the X donor or chalcogenide reactant. Without wishing to be bound by scientific theory, the injection of the chalcogenide permits discrete nucleation and results in the growth of quantum dots including the metal and the chalcogenide. A first absorbance peak of the quantum dots will be dependent upon the particular semiconductor being formed and the corresponding band-gap of the semiconductor. For example, an exemplary first absorbance peak for a CdSe nanocrystal may be between about 420 nm and 480 nm. According to one aspect, CdSe quantum dots having a first absorbance peak between about 420 nm and 480 nm are formed within about 0.5 seconds to about 10 seconds after injection of the chalcogenide into the solvent including the metal precursor. According to one aspect, CdSe quantum dots having a first absorbance peak between about 420 nm and 480 nm are formed within about 1 second to about 8 seconds, within about 1 second to about 5 seconds or immediately after injection of the chalcogenide into the solvent including the metal precursor.

After quantum dots are formed in the reaction vessel, the reaction may be terminated or quenched by, for example, cooling the reaction mixture. According to one aspect, the reaction vessel is cooled to a temperature of below about 100° C. or lower using a suitable heat sink. According to one aspect, the reaction vessel is submerged in a cooling bath such that rapid cooling of the reaction mixture is achieved. Cooling baths according to the present disclosure include any suitable cooling bath medium. Exemplary cooling baths include water or other fluids which can be maintained at low temperatures suitable for rapidly cooling reaction media and include a bath of squalane cooled with liquid nitrogen. The reaction vessel can then be contacted with the bath and the temperature of the reaction vessel is lowered to a temperature at which the reaction terminates.

According to one aspect, the size of the quantum dots produced as a result of rapid injection followed by immediate and rapid cooling may be dependent upon the initial reaction temperature of the liquid solvent. For example, it is contemplated that a higher initial reaction temperature may produce larger quantum dots insofar as the time it takes to rapidly cool the reaction vessel to a temperature of below about 100° C. or lower will be longer when the initial reaction temperature is higher. According to this aspect, a method is provided for producing quantum dots of a particular size by selecting an initial reaction temperature followed by rapid injection and then immediate and rapid cooling of the reaction mixture to a temperature at which the reaction terminates.

The quantum dots produced as a result of rapid injection and rapid cooling are then combined with an M donor or metal precursor and an X donor under conditions which allow the quantum dots to grow in size by addition of the metal and the chalcogenide. According to one aspect, the quantum dots produced as a result of rapid injection and rapid cooling are isolated or recovered, for example by precipitation with additional of butanol and methanol in a ratio of 1 to 1.5 to 0.5 v/v/v quantum dot stock solution to butanol to methanol, and then placed into a non-coordinating solvent in a reaction vessel at a temperature of between about 200° C. to about 250° C., between about 210° C. to about 240° C. or between about 220° C. to about 240° C. Non-coordinating solvents include 1-decene, 1-dodecene, 1-tetradecene, 1-hexadecene, 1-octadecene, 1-icosene and 1-docosene and the like.

An M donor such as a metal precursor and an X donor (such as, but not limited to, a chalcogen source comprising, e.g., a secondary phosphine chalcogenide) are added as reactants in a substantially continuous manner to the reaction vessel. In an exemplary reaction, Cd and Se precursor are prepared in separate vessels at 0.5 M concentration in a solution of trioctylphosphine, and introduced into the reaction vessel containing 480 nm absorbing seed particles (7.7 mmol Cd in 320 mL ODE), at a rate of 40 mL/hour. Exemplary metal precursors include cadmium oleate and the like. Exemplary secondary phosphine chalcogenides includes a dialkylphosphine selenide such as diisobutylphosphine selenide or diphenylphosphine selenide and the like.

As the M donor such as a metal precursor and an X donor are added to the reaction vessel, they are consumed as reactants in the growth process of the quantum dots. According to this aspect, the quantum dots grow in size as reactants are continuously fed into the reaction vessel and consumed in the growth process. According to one aspect, the M donor such as a metal precursor and an X donor are added using methods and devices known to those of skill in the art to meter reactants into a reaction vessel at a desired rate, such as a syringe pump. The metal precursor, also referred to herein as a metal source or a metal donor is provided in a liquid medium including, for example, but not limited to, trioctylphosphine, 1-octadecene or mixtures thereof, at a temperature of between about 20° C. to about 25° C. and a concentration of between about 0.25M to about 1.0M. The chalcogen source is provided in a liquid medium including, for example, but not limited to, trioctylphosphine, 1-octadecene, N-dodecylpyrrolidone or mixtures thereof, at a temperature of between about 20° C. to about 25° C. and a concentration of between about 0.25M to about 1.0M.

According to one aspect, the quantum dot, which may be also referred to as a core, is continuously grown in size from its initial size to a final size or from an initial first absorbance peak to a final absorbance peak. For example, the core may have an initial first absorbance peak of between about 420 nm to about 480 nm. The core may be grown, such as continuously, to a final first absorbance peak of between about 450 nm to about 600 nm, such as 500 nm, 520 nm, 540 nm, 560 nm or 580 nm. According to this aspect, the quantum dots or cores are grown to a final size or final first absorbance peak as precursors are continuously added to the reaction vessel.

According to an exemplary aspect, quantum dot core particles are made by reaction of Cd(ODPA) and diisobutylphosphine selenide, which is a highly reactive selenium precursor, in a reaction medium. Prior to the point at which the quantum dots begin to react together in a process called Ostwald ripening or broadening, the reaction is terminated such as by rapidly cooling the reaction medium. According to one aspect, prior to the point at which the quantum dots begin to react together in a process called Ostwald ripening or broadening, the reaction medium is rapidly cooled and the quantum dots are "crashed" or precipitated or separated out of the reaction medium. The quantum dots are redispersed into ODE and heated to about 240° C. The medium is then infused with Cd(Oleate) and diisobutylphosphine selenide in 0.5M TOP. According to one aspect, the reactivity of diisobutylphosphine selenide is altered by altering the amount of TOP. For example, more TOP results in less reactivity of the diisobutylphosphine selenide. The growth of quantum dots is monitored which reveals continuous red-shifting and narrowing of the absorbance spectrum.

Resulting quantum dots are members of a population of quantum dots. As a result of the discrete nucleation and rapid cooling described herein, the population of quantum dots that can be obtained has a narrow, monodisperse distribution of diameters. The monodisperse distribution of diameters can also be referred to as a "size." Preferably, a monodisperse population of particles includes a population of particles wherein at least about 60% of the particles in the population fall within a specified particle size range. A population of monodisperse particles preferably deviate less than 15% rms (root-mean-square) in diameter and more preferably less than 10% rms and most preferably less than 5% rms.

Quantum dots of the present invention may be between about 2.2 nm and about 2.6 nm in diameter or between about 2.8 nm and about 6.0 nm in diameter. In general, quantum dots according to the present disclosure can have an average particle size in a range from about 1 to about 1000 nanometers (nm), and preferably in a range from about 1 to about 100 nm. In certain embodiments, quantum dots have an average particle size in a range from about 1 to about 20 nm (e.g., such as about 2, 3, 4, 5, 6, 7, 8, 9, 10, 11, 12, 13, 14, 15, 16, 17, 18, 19, or 20 nm). In certain embodiments, quantum dots have an average particle size in a range from about 1 nm to about 20 nm or about 1 nm to about 10 nm. Quantum dots can have an average diameter less than about 150 Angstroms (Å). In certain embodiments, quantum dots having an average diameter in a range from about 12 to about 150 Å can be particularly desirable. However, depending upon the composition, structure, and desired emission wavelength of the quantum dot, the average diameter may be outside of these ranges.

According to embodiments described herein, the methods described herein produce quantum dots characterized by a continuous wavelength shift to the red and a narrowing of the full-width at half maximum (FWHM) of the emission peak which is consistent with the theory of nanocrystal growth from molecular precursors.

According to an additional aspect of the present invention, the M donor such as a metal precursor and an X donor such as a chalcogen or pnictogen source which are continuously added as reactants to generate quantum dot growth are consumed quantitatively to the extent that nearly 100% of the reactants metered into the reaction vessel are used to increase the size of the quantum dots.

Compared to conventional methods of making quantum dots, the exemplary method of rapid injection followed by immediate and rapid cooling to terminate the reaction resulting in seed core quantum dot particles and then quantum dot growth by continuous supply of reactants provides a greater number of seed core quantum dot particles having a first absorbance peak between about 420 nm to about 480 nm and accordingly a greater number of quantum dots having a first absorbance peak of between about 450 nm to about 600 nm resulting from the growth step.

In certain embodiments, quantum dots can include a core having one or more semiconductor materials and a shell comprising one or more semiconductor materials, wherein the shell is disposed over at least a portion, and preferably all, of the outer surface of the core. A quantum dot including a core and shell is also referred to as a "core/shell" structure.

As discussed herein, a shell can be a semiconductor material. The shell can comprise an overcoat including one or more semiconductor materials on a surface of the core. Examples of semiconductor materials that can be included in a shell include, but are not limited to, a Group IV element, a Group II-VI compound, a Group II-V compound, a Group III-VI compound, a Group III-V compound, a Group IV-VI compound, a Group compound, a Group II-IV-VI compound, a Group II-IV-V compound, alloys including any of the foregoing, and/or mixtures including any of the foregoing, including ternary and quaternary mixtures or alloys. Examples include, but are not limited to, ZnO, ZnS, ZnSe, ZnTe, CdO, CdS, CdSe, CdTe, MgS, MgSe, GaAs, GaN, GaP, GaSe, GaSb, HgO, HgS, HgSe, HgTe, InAs, InN, InP, InSb, AlAs, AlN, AlP, AlSb, TlN, TlP, TlAs, TlSb, PbO, PbS, PbSe, PbTe, Ge, Si, an alloy including any of the foregoing, and/or a mixture including any of the foregoing. For example, ZnS, ZnSe or CdS overcoatings can be grown on CdSe or CdTe semiconductor nanocrystals.

In a core/shell quantum dot, the shell or overcoating may comprise one or more layers. The overcoating can comprise at least one semiconductor material which is the same as or different from the composition of the core. Preferably, the overcoating has a thickness from about one to about ten monolayers. An overcoating can also have a thickness greater than ten monolayers. In certain embodiments, more than one overcoating can be included on a core.

In certain embodiments, the surrounding "shell" material can have a band gap greater than the band gap of the core material. In certain other embodiments, the surrounding shell material can have a band gap less than the band gap of the core material.

In certain embodiments, the shell can be chosen so as to have an atomic spacing close to that of the "core" substrate. In certain other embodiments, the shell and core materials can have the same crystal structure.

Examples of quantum dot (e.g., semiconductor nanocrystal) (core)shell materials include, without limitation: red (e.g., (CdSe)CdZnS (core)shell), green (e.g., (CdZnSe) CdZnS (core)shell, etc.), and blue (e.g., (CdS)CdZnS (core) shell.)

An example of an overcoating process is described, for example, in U.S. Pat. No. 6,322,901 incorporated herein in its entirety by reference. By adjusting the temperature of the reaction mixture during overcoating and monitoring the absorption spectrum of the core, overcoated materials having high emission quantum efficiencies (EQE) and narrow size distributions can be obtained.

The narrow size distribution of the quantum dots (including, e.g., semiconductor nanocrystals) allows the possibility of light emission in narrow spectral widths. Monodisperse semiconductor nanocrystals have been described in detail in Murray et al. (*J. Am. Chem. Soc.*, 115:8706 (1993)) hereby incorporated herein by reference in its entirety.

Size distribution during the reaction process can be estimated by monitoring the absorption or emission line widths of the particles. Modification of the reaction temperature in response to changes in the absorption spectrum of the particles allows the maintenance of a sharp particle size distribution during growth. Reactants can be added to the nucleation solution during crystal growth to grow larger crystals. For example, for CdSe and CdTe, by stopping growth at a particular semiconductor nanocrystal average diameter and choosing the proper composition of the semiconducting material, the emission spectra of the semiconductor nanocrystals can be tuned continuously over the wavelength range of 300 nm to 5 microns, or from 400 nm to 800 nm.

The particle size distribution of the quantum dots (including, e.g., semiconductor nanocrystals) can be further refined by size selective precipitation with a poor solvent for the quantum dots, such as methanol/butanol. For example, quantum dots can be dispersed in a solution of 10% butanol in hexane. Methanol can be added dropwise to this stirring solution until opalescence persists. Separation of supernatant and flocculate by centrifugation produces a precipitate enriched with the largest crystallites in the sample. This procedure can be repeated until no further sharpening of the optical absorption spectrum is noted. Size-selective precipitation can be carried out in a variety of solvent/nonsolvent pairs, including pyridine/hexane and chloroform/methanol. The size-selected quantum dot (e.g., semiconductor nanocrystal) population preferably has no more than a 15% rms deviation from mean diameter, more preferably 10% rms deviation or less, and most preferably 5% rms deviation or less.

According to one aspect of the present disclosure, quantum dots of the present invention can include ligands attached thereto, such as aliphatic ligands. Such aliphatic ligands promote adhesion with a carrier particle. Such aliphatic ligands promote solubility or dispersability of the quantum dots bound to the carrier particles in a curable or polymerizable matrix material. According to one aspect, exemplary ligands include oleic acid ligands and octadecylphosphonic acid ("ODPA") ligands.

Ligands can be derived from a coordinating solvent that may be included in the reaction mixture during the growth process. Alternatively, ligands can be added to the reaction mixture or ligands can be derived from a reagent or precursor included in the reaction mixture for synthesizing the quantum dots. In certain embodiments, quantum dots can include more than one type of ligand attached to an outer surface.

A quantum dot surface that includes ligands derived from the growth process or otherwise can be modified by repeated exposure to an excess of a competing ligand group (including, e.g., but not limited to, a coordinating group) to exchange out the initial or native surface ligands, and/or to form an overlayer. For example, a dispersion of capped quantum dots can be treated with a coordinating organic compound, such as pyridine, to produce crystallites which disperse readily in pyridine, methanol, and aromatics but no longer disperse in aliphatic solvents. Such a surface exchange process can be carried out with any compound capable of coordinating to or bonding with the outer surface of the nanoparticle, including, for example, but not limited to, phosphines, thiols, amines and phosphates.

For example, a quantum dot can be exposed to short chain polymers which exhibit an affinity for the surface and which terminate in a moiety having an affinity for a suspension or dispersion medium, such as a curable matrix material. Such affinity improves the stability of the suspension and discourages flocculation of the quantum dot. Examples of additional ligands include fatty acids, long chain fatty acids such as oleic acid, alkyl phosphines, alkyl phosphine oxides, alkyl phosphonic acids, or alkyl phosphinic acids, pyridines, furans, and amines. More specific examples include, but are not limited to, pyridine, tri-n-octyl phosphine (TOP), tri-n-octyl phosphine oxide (TOPO), tris-hydroxylpropylphosphine (tHPP) and octadecylphosphonic acid ("ODPA"). Technical grade TOPO can be used.

Suitable coordinating ligands can be purchased commercially or prepared by ordinary synthetic organic techniques, for example, as described in J. March, Advanced Organic Chemistry, which is incorporated herein by reference in its entirety.

The emission from a quantum dot capable of emitting light can be a narrow Gaussian emission band that can be tuned through the complete wavelength range of the ultraviolet, visible, or infra-red regions of the spectrum by varying the size of the quantum dot, the composition of the quantum dot, or both.

For example, a semiconductor nanocrystal comprising CdSe can be tuned in the visible region; a semiconductor nanocrystal comprising InAs can be tuned in the infra-red region. The narrow size distribution of a population of quantum dots capable of emitting light can result in emission of light in a narrow spectral range. The population can be monodisperse and preferably exhibits less than a 15% rms (root-mean-square) deviation in diameter of such quantum dots, more preferably less than 10%, most preferably less than 5%. Spectral emissions in a narrow range of no greater than about 75 nm, preferably no greater than about 60 nm, more preferably no greater than about 40 nm, and most preferably no greater than about 30 nm full width at half max (FWHM) for such quantum dots that emit in the visible can be observed. IR-emitting quantum dots can have a FWHM of no greater than 150 nm, or no greater than 100 nm. Expressed in terms of the energy of the emission, the emission can have a FWHM of no greater than 0.05 eV, or no greater than 0.03 eV. The breadth of the emission decreases as the dispersity of the light-emitting quantum dot diameters decreases.

Quantum dots can have emission quantum efficiencies such as between 0% to greater than 95%, for example in solution, such as greater than 10%, 20%, 30%, 40%, 50%, 60%, 70%, 80%, or 90%.

Quantum dots produced according to the present invention may be used in various applications. According to one aspect, quantum dots produced according to the methods described herein may be used in photoluminescent (PL) applications where quantum dot materials are excited optically and the optical excitation is downconverted via emission from the QDs. According to this aspect, exemplary applications include devices or systems where an LED light source is used, for example solid-state lighting, LED Backlights (LED-BLU), Liquid Crystal Displays (LCD) and the like. According to an additional aspect, quantum dots produced according to the methods described herein may be used in a device or system where a light source is downconverted to other wavelengths (e.g. solar concentrators or downconverters where sunlight is converted to specific wavelengths tuned to the highest efficiency window of the solar cells used in the system. Additional applications include plasma based systems where high energy plasma emission can excite a quantum dot downconverter, taggants, bio-labeling or imaging application, and barcoding or security/covert labeling applications. According to an additional aspect, quantum dots produced according to the present invention may be used in electroluminescent (EL) applications where quantum dots are excited electrically and the excitation results in emission from the quantum dots. According to this aspect, exemplary applications include direct charge injection into the quantum dots generating quantum dot excited states and subsequent quantum dot emission, energy transfer from other semiconductor materials within the device to the quantum dots, generating an excited state and subsequent quantum dot emission and the like.

According to an additional aspect, quantum dots produced according to the present invention may be used in photovoltaic (PV) applications where the quantum dot materials are excited optically and the excitation results in current generation and/or a voltage due to carrier extraction from the quantum dots.

Additional information that may be useful in connection with the present disclosure and the inventions described herein is included in International Application No. PCT/US2009/002796 of Coe-Sullivan et al, filed 6 May 2009, entitled "Optical Components, Systems Including An Optical Component, And Devices"; International Application No. PCT/US2009/002789 of Coe-Sullivan et al, filed 6 May 2009, entitled: "Solid State Lighting Devices Including Quantum Confined Semiconductor Nanoparticles, An Optical Component For A Solid State Light Device, And Methods"; International Application No. PCT/US2010/32859 of Modi et al, filed 28 Apr. 2010 entitled "Optical Materials, Optical Components, And Methods"; International Application No. PCT/US2010/032799 of Modi et al, filed 28 Apr. 2010 entitled "Optical Materials, Optical Components, Devices, And Methods"; International Application No. PCT/US2011/047284 of Sadasivan et al, filed 10 Aug. 2011 entitled "Quantum Dot Based Lighting"; U.S. patent application Ser. No. 12/283,609 of Coe-Sullivan et al, filed 12 Sep. 2008 entitled "Compositions, Optical Component, System Including An Optical Component, Devices, And Other Products"; International Application No. PCT/US2008/10651 of Breen et al, filed 12 Sep. 2008 entitled "Functionalized Nanoparticles And Method"; and International Application No. PCT/US2007/024320 of Clough et al, filed 21 Nov. 2007, entitled "Nanocrystals Including A Group Ma Element And A Group Va Element, Method, Composition, Device And Other Products"; U.S. application 61/486,748 filed May 16, 2011 entitled "Method for Preparing Semiconductor Nanocrystals" each of the foregoing being hereby incorporated herein by reference in its entirety.

EXAMPLE I

Comparison of the Effect of Initial Reaction Temperature on the Size of Semiconductor Nanocrystals Synthesis of CdSe Cores: 45.94 mmol cadmium acetate was dissolved in 669.55 mmol of tri-n-octylphosphine at 100° C. in a 250 mL 3-neck round-bottom flask and then dried and degassed for one hour. 814.69 mmol of trioctylphosphine oxide and 104.85 mmol of octadecylphosphonic acid were added to a 0.5 L stainless steel reactor and dried and degassed at 140° C. for one hour. After degassing, the Cd solution was added to the reactor containing the oxide/acid and the mixture was heated to 270° C. under nitrogen, Once the temperature reached 270° C., the heating mantle was removed from the reactor and 139.9 mmol of diisobutylphosphine selenide (DIBP-Se) dissolved in 105 mL of 1-Dodecyl-2-pyrrolidinone (NDP) (1.5 M DIBP-Se) was then rapidly injected. The reactor was then immediately submerged in partially frozen (via liquid nitrogen) squalane bath rapidly reducing the temperature of the reaction to below 100° C. The first absorption peak of the nanocrystals was 454 nm. The CdSe cores were precipitated out of the growth solution inside a nitrogen atmosphere glovebox by adding a 3:1 mixture of methanol and isopropanol. The isolated cores were then dissolved in hexane and used to make core-shell materials.

Synthesis of CdSe Cores: 45.94 mmol cadmium acetate was dissolved in 669.55 mmol of tri-n-octylphosphine at 100° C. in a 250 mL 3-neck round-bottom flask and then dried and degassed for one hour. 814.69 mmol of trioctylphosphine oxide and 104.85 mmol of octadecylphosphonic acid were added to a 0.5 L stainless steel reactor and dried and degassed at 140° C. for one hour. After degassing, the Cd solution was added to the reactor containing the oxide/acid and the mixture was heated to 310° C. under nitrogen. Once the temperature reached 310° C., the heating mantle was removed from the reactor and 139.9 mmol of diisobutylphosphine selenide (DIBP-Se) dissolved in 105 mL of 1-Dodecyl-2-pyrrolidinone (NDP) (1.5 M DIBP-Se) was then rapidly injected. The reactor was then immediately submerged in partially frozen (via liquid nitrogen) squalane bath rapidly reducing the temperature of the reaction to below 100° C. The first absorption peak of the nanocrystals was 480 nm. The CdSe cores were precipitated out of the growth solution inside a nitrogen atmosphere glovebox by adding a 3:1 mixture of methanol and isopropanol. The isolated cores were then dissolved in hexane and used to make core-shell materials.

Synthesis of CdSe Cores: 45.94 mmol cadmium acetate was dissolved in 669.55 mmol of tri-n-octylphosphine at 100° C. in a 250 mL 3-neck round-bottom flask and then dried and degassed for one hour. 814.69 mmol of trioctylphosphine oxide and 104.85 mmol of octadecylphosphonic acid were added to a 0.5 L stainless steel reactor and dried and degassed at 140° C. for one hour. After degassing, the Cd solution was added to the reactor containing the oxide/acid and the mixture was heated to 320° C. under nitrogen. Once the temperature reached 320° C., the heating mantle was removed from the reactor and 139.9 mmol of diisobutylphosphine selenide (DIBP-Se) dissolved in 105 mL of 1-Dodecyl-2-pyrrolidinone (NDP) (1.5 M DIBP-Se) was then rapidly injected. The reactor was then immediately submerged in partially frozen (via liquid nitrogen) squalane bath rapidly reducing the temperature of the reaction to below 100° C. The first absorption peak of the nanocrystals was 492 nm. The CdSe cores were precipitated out of the growth solution inside a nitrogen atmosphere glovebox by adding a 3:1 mixture of methanol and isopropanol. The isolated cores were then dissolved in hexane and used to make core-shell materials.

As indicated above, a higher the initial reaction temperature produced a longer first absorption peak of the quantum dot such as a more red first absorption peak quantum dot. For example, an initial reaction temperature of 320° C. produced quantum dots with a first absorption peak of 492 nm. An initial reaction temperature of 310° C. produced quantum dots with a first absorption peak of 480 nm. An initial reaction temperature of 270° C. produced quantum dots with a first absorption peak of 454 nm.

EXAMPLE II

Comparison of One Step Nucleation and In-Situ Growth Process with a Two Step Core Production and Growth Method Quantum dots having a first absorbance peak of 565 nm were prepared using a one step nucleation and growth process without quenching as follows. Seed CdSe cores with a first absorbance peak at 480 nm (8.3 mmol Cd) are dissolved into 320 mL of 1-octadecene and degassed at 100° C. for 1 hour. The temperature is increased to 240° C., upon which a 0.5M solution of Cd(Oleate) in trioctylphosphine, and a 0.5M solution of diisobutylphosphine selenide in trioctylphosphine are infused simultaneously at a rate of 40 mL/hour for approximately 1 hour. The reaction vessel is sampled intermittently to measure the red-shift of the first absorbance peak, and infusion of precursor is terminated when the desired first absorbance peak is reached. The reaction vessel is air-cooled to room temperature. The cores as grown can be stored and used in subsequent overcoating reactions without further purification.

Cores initially synthesized using the one step method exhibited a phosphonic acid-based ligand coating. However, during the growth method with infusion of Cd(Oleate) and dialkylphosphine selenides, the surface functionality changed to that of oleic acid after growth. The materials used in the traditional process and the process described herein are set forth in Table 1 below.

As shown in Table 2 below, the traditional core synthesis method in a typical synthesis with 26.3 mmol Cd input and targeting a 560 nm core quantum dot produced a total CdSe output of 4.4 mmol or a 16.8% overall yield. The two step method of the present disclosure in a typical reaction with the same 26.3 mmol Cd input targeting 480 nm seed particles followed by a growth step to target 560 nm core quantum dots produced a total CdSe output of 63.5 mmol or an 84% overall yield while outputting about 14 times more material per core synthesis (63.5 v. 4.4 mmol of 560 nm CdSe core output).

TABLE 2

| Traditional Core Nucleation | |
|---|---|
| Cd Input [mmol] | 26.3 |
| CdSe @ 560 nm [mmol] | 4.4 |
| % Yield Overall | 16.8% |
| Separated Nucleation and Growth Steps | |
| Step 1 Nucleation | |
| Cd Input [mmol] | 26.3 |
| Step 1% Yield | 55.3% |
| Step 2-Growth | |
| Cd Input | 49.0 |
| CdSe Output @ 560 nm | 63.5 |
| % Yield Overall | 84.3% |

FIG. 1 is an absorbance spectrum comparing quantum dots made by the two step nucleation and quenching and further growth methods disclosed herein and quantum dots made by a standard process of nucleation and growth in a closed system without quenching or continuous introduction of reactants. As can be seen, the absorbance spectrum for the quantum dots made according to the two step nucleation and quenching and further growth methods disclosed herein includes more distinct features evidencing a higher size distribution compared to the quantum dots made by the traditional process.

EXAMPLE III

Preparation of Semiconductor Nanocrystals Capable of Emitting Red Light with a CdS Shell Synthesis of CdSe/CdS Core-Shell Nanocrystals: CdSe cores made according to Example II were coated as follows. 517.3 mmol of trioctylphosphine oxide, 48.3 mmol of Octadecylphosphonic acid, and 40 mL of trioctylphosphine were loaded into a 0.5 L glass reactor. The mixture was then dried

TABLE 1

| Traditional Core Process for 565 nm QDs | | | | Master Core Process for 480 nm QDs | | | |
|---|---|---|---|---|---|---|---|
| Material | Amount | Unit | mMol | Material | Amount | Unit | mMol |
| TOPO | 1800 | g | 4655.37 | TOPO | 1800 | g | 4655.37 |
| ODPA | 200.4 | g | 599.16 | ODPA | 200.4 | g | 599.16 |
| TOP | 1052 | mL | | TOP | 1052 | mL | |
| | (872.7 | g) | | | (872.7 | g) | |
| Cd(OAc)$_2$ | 60.5 | g | 262.5 | Cd(OAc)$_2$ | 60.5 | g | 262.5 |
| TBP | 600 | mL | | NDP | 600 | mL | |
| | (492 | g) | | | | | |
| TBP-Se (1.5M) | 105 | mL | | DIBP-Se | 202.7 | g | 799.7 |
| | (551 | g) | | | | | |
| Selenium shot | 72.84 | g | 922.49 | | | | | and degassed in the reactor by heating to 120° C. for about an hour. The reactor was then cooled to 70° C. and the hexane solution containing isolated CdSe cores (1.98 mmol Cd content) was added to the reaction mixture. The hexane was removed under reduced pressure followed by the addition of 85.33 mmol of decylamine. Dimethyl cadmium and hexamethyldisilathiane were used as the Cd and S precursors, respectively. The Cd and S were mixed in equimolar ratios. The Cd (8.04 mmol of dimethylcadmium) and S (8.04 mmol of hexamethyldisilathiane) samples were each dissolved in 40 mL of trioctylphosphine inside a nitrogen atmosphere glove box. Once the precursor solutions were prepared, the reaction flask was heated to 155° C. under nitrogen. The precursor solutions were added dropwise over the course of 2 hours at 155° C. using a syringe pump (an additional 3 mL of trioctylphosphine is used to flush the overcoating precursor lines and the reaction is allowed to proceed for an additional 15 minutes). After the shell growth, the nanocrystals were transferred to a nitrogen atmosphere glovebox and precipitated out of the growth solution by adding a 3:1 mixture of methanol and isopropanol. The isolated core-shell nanocrystals were then dissolved in hexane and precipitated a second time by adding a 3:1 mixture of methanol and isopropanol. The isolated core-shell nanocrystals were then dissolved in hexane and used to make QLEDs. The material specifications were as follows: Abs=602 nm; Emission=615 nm; FWHM=29 nm; QY=60% in Hexane.

EXAMPLE IV

Preparation of Semiconductor Nanocrystals Capable of Emitting Green Light with 3,5-di-tert-butyl-4-hydroxybenzylphosphonic acid Synthesis of CdSe Cores: 45.94 mmol cadmium acetate was dissolved in 669.55 mmol of tri-n-octylphosphine at 100° C. in a 250 mL 3-neck round-bottom flask and then dried and degassed for one hour. 814.69 mmol of trioctylphosphine oxide and 104.85 mmol of octadecylphosphonic acid were added to a 0.5 L stainless steel reactor and dried and degassed at 140° C. for one hour. After degassing, the Cd solution was added to the reactor containing the oxide/acid and the mixture was heated to 240° C. under nitrogen. Once the temperature reached 240° C., the heating mantle is removed from the reactor and 105 mL of 1.5 M aerated TBP-Se (see preparation below) was then rapidly injected. The reactor is then immediately submerged in partially frozen (via liquid nitrogen) squalane bath rapidly reducing the temperature of the reaction to below 100° C. The first absorption peak of the nanocrystals was 442 nm. The CdSe cores were precipitated out of the growth solution inside a nitrogen atmosphere glovebox by adding a 3:1 mixture of methanol and isopropanol. The isolated cores were then dissolved in hexane and used to make core-shell materials.

Preparation of Aerated TBP-Se: 9.5 mol of tri-butyl phosphine (TBP) (Strem Lot A4329040) was loaded into a 3 L 3-neck round-bottom flask. A tank of dry compressed air was used to bubble dry air into the TBP at a rate of 4 L per minute. The temperature of the TBP was monitored during the aeration process.

| Elapsed Time (min) | Temperature (° C.) |
| --- | --- |
| 0 | 22.8 |
| 14 | 30.7 |
| 58 | 43.1 |
| 80 | 47.1 |
| 108 | 54.9 |
| 188 | 79.5 |

This aerated TBP was then used to make the 1.5 M TBP-Se by adding Se shot with stirring in an inert atmosphere for use in the core preparation above. Aeration is discontinued prior to elimination of any secondary phosphine formed during the aeration step.

Synthesis of Green Emitting CdSe/CdZnS Core-Shell Nanocrystals: 517.3 mmol of trioctylphosphine oxide and 48.3 mmol of 3,5-di-tert-butyl-4-hydroxybenzylphosphonic acid were loaded into a 0.5 L glass reactor. The mixture was then dried and degassed in the reactor by heating to 120° C. for about an hour. The reactor was then cooled to 70° C. and the hexane solution containing isolated CdSe cores (1.55 mmol Cd content) was added to the reaction mixture. The hexane was removed under reduced pressure. Dimethyl cadmium, diethyl zinc, and hexamethyldisilathiane were used as the Cd, Zn, and S precursors, respectively. The Cd and Zn were mixed in equimolar ratios while the S was in two-fold excess relative to the Cd and Zn. The Cd/Zn (14.5 mmol and 33.8 mmol respectively) and S (48.3 mmol) samples were each dissolved in 40 mL of trioctylphosphine inside a nitrogen atmosphere glove box. Once the precursor solutions were prepared, the reaction flask was heated to 155° C. under nitrogen. The precursor solutions were added dropwise to the reactor at 155° C. at a rate of 20 mL per hour using a syringe pump. After the reaction proceeded for 1 hour, the precursor injection was stopped and the reaction temperature was allowed to return to room temperature. The nanocrystals were precipitated out of the growth solution by transferring to a 3:1 mixture of methanol and isopropanol and then isolating in a nitrogen atmosphere glovebox. The isolated core-shell nanocrystals were then dissolved in toluene. The material specifications were as follows: Emission=532 nm; FWHM=29 nm; QY=85% in toluene.

EXAMPLE V

Preparation of Semiconductor Nanocrystals Capable of Emitting Red Light with a CdS Shell Synthesis of CdSe Cores: 26.23 mmol cadmium acetate was dissolved in 235.4 mmol of tri-n-octylphosphine at 100° C. in a 250 mL 3-neck round-bottom flask and then dried and degassed for one hour. 465.5 mmol of trioctylphosphine oxide and 59.8 mmol of octadecylphosphonic acid were added to a 0.5 L stainless steel reactor and dried and degassed at 140° C. for one hour. After degassing, the Cd solution was added to the reactor containing the oxide/acid and the mixture was heated to 298° C. under nitrogen. Once the temperature reached 298° C., 425 mmol of aerated tri-n-butylphosphine (see preparation below) was injected into the flask. The temperature of the mixture was then raised to 305° C. where 105 mL of 1.5 M aerated TBP-Se (see preparation below) was then rapidly injected. The reaction was allowed to proceed for 13 minutes (aliquots taken at 1 minute intervals to observe the growth and corresponding absorption wavelength shift) at which point the reactor was then immediately submerged in partially frozen (via liquid nitrogen) squalane bath rapidly reducing the temperature of the reaction to below 100° C. The first absorption peak of the nanocrystals was 561 nm. The CdSe cores were precipitated out of the growth solution inside a nitrogen atmosphere glovebox by adding a 3:1 mixture of methanol and isopropanol. The isolated cores (abs=557 nm) were then dissolved in hexane and used to make core-shell materials.

Preparation of Aerated TBP-Se: 9.5 mol of TBP (Strem Lot A4329040) was loaded into a 3 L 3-neck round-bottom flask. A tank of dry compressed air was used to bubble dry air into the TBP at a rate of 4 L per minute. The temperature of the TBP was monitored during the aeration process.

| Elapsed Time (min) | Temperature (° C.) |
|---|---|
| 0 | 22.8 |
| 14 | 30.7 |
| 58 | 43.1 |
| 80 | 47.1 |
| 108 | 54.9 |
| 188 | 79.5 |

This aerated TBP was then combined with pure TBP (Strem 99%) in a ratio of 1:3 and then used as aerated TBP. The TBP-Se was made by mixing 105 mL of aerated TBP with 13.03 g of Se shot generating 1.5 M TBP-Se used in the core preparation above.

Synthesis of CdSe/CdS Core-Shell Nanocrystals: 517.3 mmol of trioctylphosphine oxide and 48.3 mmol of Octadecylphosphonic acid were loaded into a 0.5 L glass reactor. The mixture was then dried and degassed in the reactor by heating to 120° C. for about an hour. The reactor was then cooled to 70° C. and the hexane solution containing isolated CdSe cores (1.98 mmol Cd content) was added to the reaction mixture. The hexane was removed under reduced pressure followed by the addition of 85.33 mmol of decylamine. Dimethyl cadmium and hexamethyldisilathiane were used as the Cd and S precursors, respectively. The Cd and S were mixed in equimolar ratios. The Cd (10.37 mmol of dimethylcadmium) and S (10.37 mmol of hexamethyldisilathiane) samples were each dissolved in 40 mL of trioctylphosphine inside a nitrogen atmosphere glove box. Once the precursor solutions were prepared, the reaction flask was heated to 155° C. under nitrogen. The precursor solutions were added dropwise over the course of 2 hours at 155° C. using a syringe pump. After the shell growth, the nanocrystals were transferred to a nitrogen atmosphere glovebox and precipitated out of the growth solution by adding a 3:1 mixture of methanol and isopropanol. The isolated core-shell nanocrystals were then dissolved in hexane and precipitated a second time by adding a 3:1 mixture of methanol and isopropanol. The isolated core-shell nanocrystals were then dissolved in hexane and used to make QLEDs. The material specifications were as follows: Abs=605 nm; Emission=619 nm; FWHM=30 nm; QY=81% in Hexane.

EXAMPLE VI

Preparation of Semiconductor Nanocrystals Capable of Emitting Green light with a CdZnS Shell Synthesis of CdSe Cores: 45.94 mmol cadmium acetate was dissolved in 669.55 mmol of tri-n-octylphosphine at 100° C. in a 250 mL 3-neck round-bottom flask and then dried and degassed for one hour. 814.69 mmol of trioctylphosphine oxide and 104.85 mmol of octadecylphosphonic acid were added to a 0.5 L stainless steel reactor and dried and degassed at 140° C. for one hour. After degassing, the Cd solution was added to the reactor containing the oxide/acid and the mixture was heated to 270° C. under nitrogen. Once the temperature reached 270° C., the heating mantle was removed from the reactor and 139.9 mmol of diisobutylphosphine selenide (DIBP-Se) dissolved in 105 mL of 1-Dodecyl-2-pyrrolidinone (NDP) (1.5 M DIBP-Se) was then rapidly injected. The reactor was then immediately submerged in partially frozen (via liquid nitrogen) squalane bath rapidly reducing the temperature of the reaction to below 100° C. The first absorption peak of the nanocrystals was 447 nm. The CdSe cores were precipitated out of the growth solution inside a nitrogen atmosphere glovebox by adding a 3:1 mixture of methanol and isopropanol. The isolated cores were then dissolved in hexane and used to make core-shell materials.

Synthesis of Green Emitting CdSe/CdZnS Core-Shell Nanocrystals: 517.3 mmol of trioctylphosphine oxide and 48.3 mmol of 3,5-di-tert-butyl-4-hydroxybenzylphosphonic acid were loaded into a 0.5 L glass reactor. The mixture was then dried and degassed in the reactor by heating to 120° C. for about an hour. The reactor was then cooled to 70° C. and the hexane solution containing isolated CdSe cores (3.96 mmol Cd content) was added to the reaction mixture. The hexane was removed under reduced pressure. Dimethyl cadmium, diethyl zinc, and hexamethyldisilathiane were used as the Cd, Zn, and S precursors, respectively. The Cd and Zn were mixed in equimolar ratios while the S was in two-fold excess relative to the Cd and Zn. The Cd/Zn (13.1 mmol and 30.4 mmol respectively) and S (43.5 mmol) samples were each dissolved in 20 mL of trioctylphosphine inside a nitrogen atmosphere glove box. Once the precursor solutions were prepared, the reaction flask was heated to 155° C. under nitrogen. The precursor solutions were added dropwise to the reactor at 155° C. at a rate of 20 mL per hour using a syringe pump. After the reaction proceeded for 1 hour, the precursor injection was stopped and the reaction temperature was allowed to return to room temperature. The nanocrystals were precipitated out of the growth solution by transferring to a 3:1 mixture of methanol and isopropanol and then isolating in a nitrogen atmosphere glovebox. The isolated core-shell nanocrystals were then dissolved in toluene and used to make quantum dot composite materials. The material specifications were as follows: Emission=520 nm; FWHM=35 nm; QY=75% in toluene.

EXAMPLE VII

Semiconductor Nanocrystals Capable of Emitting Green Light

EXAMPLE VIIA

Figure 2A:
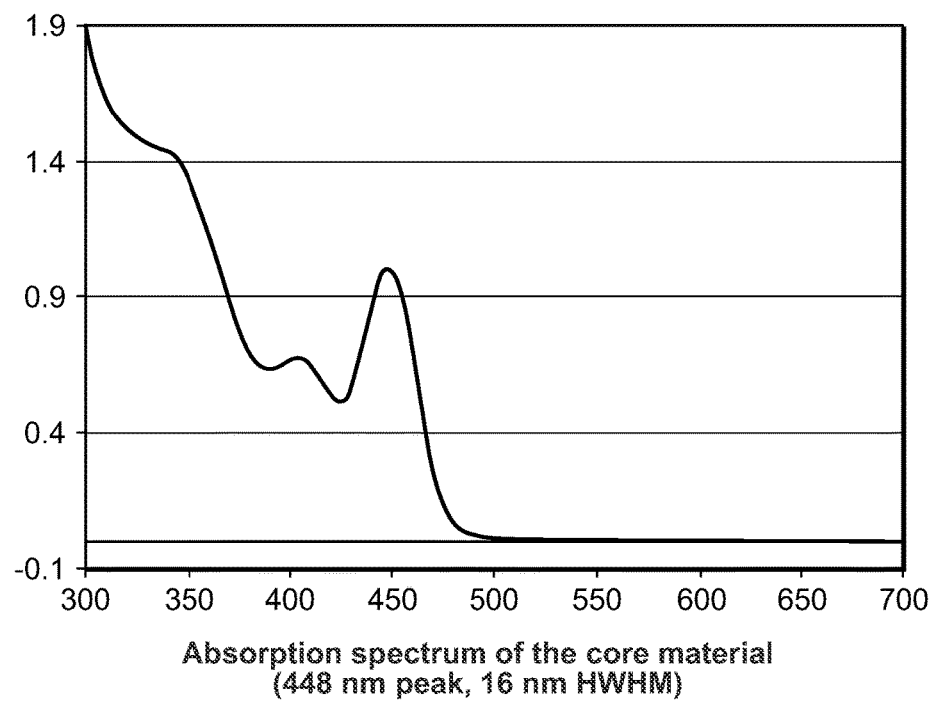
FIG. 2A graphically illustrates the Absorption spectrum referred to in Example VIIA.

Synthesis of CdSe Cores(448 nm Target): The following are added to a 1 L steel reaction vessel: trioctylphosphine oxide (51.88 g), 1-octadecene (168.46 g) 1-octadecylphosphonic acid (33.09 g, 98.92 mmol), and Cd(Oleate)$_2$ (1M solution in trioctylphosphine, 98.92 mL, 98.92 mmol). The vessel is subjected to 3 cycles of vacuum/nitrogen at 120° C., and the temperature is raised to 270° C. under nitrogen. At 270° C., a solution of 1M diisobutylphosphine selenide in N-dodecylpyrrolidone (DIBP-Se, 77.16 mL, 77.16 mmol) is rapidly injected, within a period of less than 1 second, followed by injection of 1-octadecene (63.5 mL) to rapidly drop the temperature to about 240° C. resulting in the production of quantum dots with an initial absorbance peak between 420-430 nm. 5-20 seconds after the ODE injection, a solution of Cd(Oleate)$_2$ (0.5M in a 50/50 v/v mixture of TOP and ODE) is continuously introduced along with a solution of DIBP-Se (0.4M in a 60/40 v/v mixture of N-dodecylpyrrolidone and ODE) at a rate of 29.0 mL/min. A total of 74.25 mL of each precursor is delivered while the temperature of the reactor is maintained between 205-240° C. At the end of the infusion, the reaction vessel is cooled rapidly by immersing the reactor in a squalane bath chilled with liquid nitrogen to rapidly bring the temperature down to <150° C. (within 2 minutes). The final material is used as is without further purification (First absorbance peak: 448 nm, Total volume: 702 mL, Reaction yield: 99%). The absorption spectrum of the core is shown in FIG. 2A.

EXAMPLE VIIB

Figure 2B:
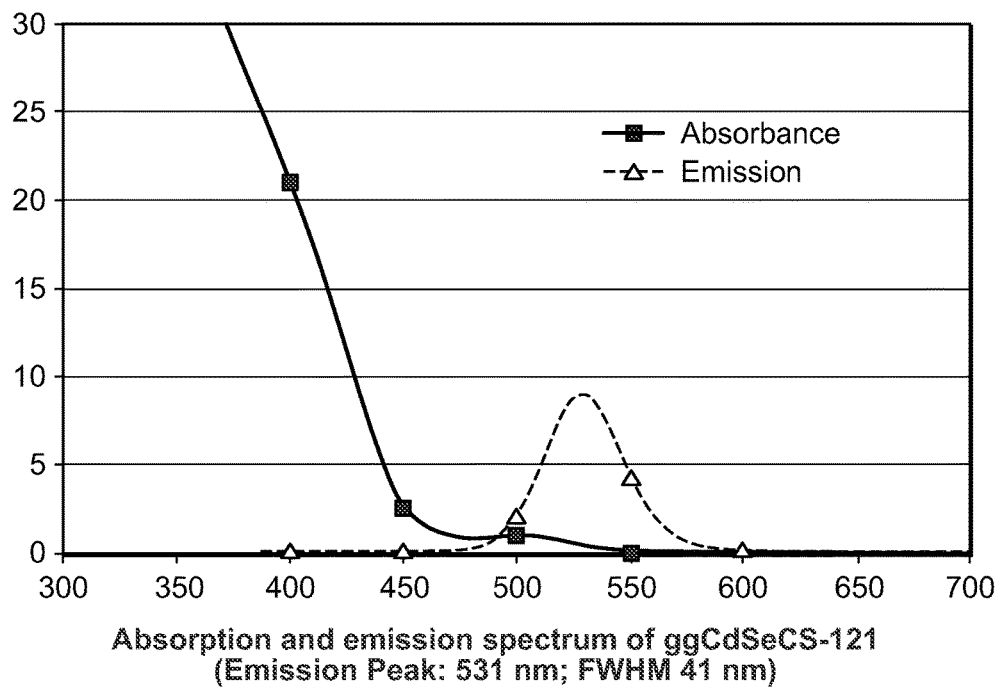
FIG. 2B graphically illustrates the absorption and emission spectra referred to in Example VIIB.

Synthesis of CdSe/ZnS/CdZnS Core/Shell/Shell: CdSe cores synthesized as described in the preceding paragraph, with a first absorbance peak of 448 nm (27.70 mL, 4.78 mmol Cd), are mixed with dodecanethiol (23.76 mL, 99.20 mmol) in a syringe. A reaction flask containing $Zn(Oleate)_2$ (99.20 mL, 0.5M in TOP) is heated to 300° C., upon which the syringe containing cores and 1-dodecanethiol is swiftly injected. When the temperature recovers to 310° C. (between 2-8 minutes (min)), the overcoat precursors are delivered via a syringe pump over a period of 32 min. The two overcoating precursor stocks include the following: 1) $Zn(Oleate)_2$ (141.25 mL, 0.5M in TOP, 70.63 mmol) mixed with $Cd(Oleate)_2$ (79.64 mL, 1.0M in TOP, 79.64 mmol), and 2) dodecanethiol (39.59 mL, 165.29 mmol) mixed 1-octadecene (3.67 mL) and n-trioctylphosphine (0.92 mL). During the overcoating precursor infusion, the temperature is kept between 320-330° C. Any volatiles from the system are allowed to distill over and leave the system in order for the temperature to reach 320-330° C. After the infusion ends, the sample is annealed for 3 minutes at 320-330° C. and cooled to room temperature over a period of 5-15 minutes. The final core/shell material is precipitated via the addition of butanol and methanol at a 2:1 ratio v/v. The pellet is isolated via centrifugation, and redispersed into toluene for storage (Emission 531 nm, FWHM 41 nm, Film EQE at RT: 99%, Film EQE at 140° C.: >90%). Absorption and emission spectra of the resulting overcoated nanocrsytals are shown in FIG. 2B.

EXAMPLE VIII

Semiconductor Nanocrystals Capable of Emitting Red Light

EXAMPLE VIIIA

Figure 3A:
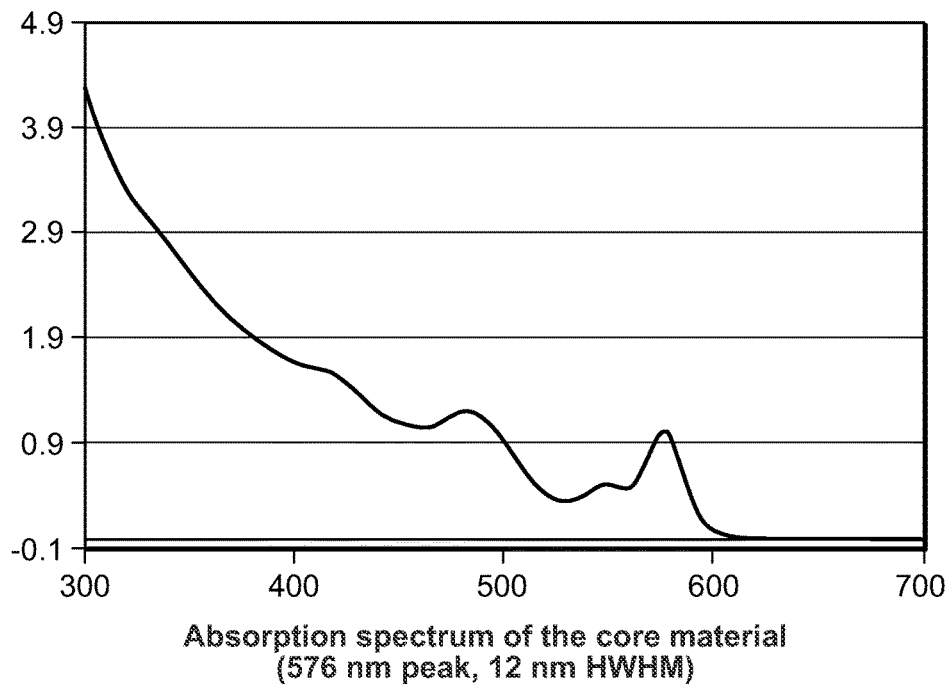
FIG. 3A graphically illustrates the Absorption spectrum referred to in Example VIIIA.

Synthesis of CdSe Cores: The following are added to a 1 L glass reaction vessel: trioctylphosphine oxide (15.42 g), 1-octadecene (ODE, 225.84 g), 1-octadecylphosphonic acid (1.88 g, 5.63 mmol). The vessel is subjected to 3 cycles of vacuum/nitrogen at 120° C., and the temperature is raised to 270° C. under nitrogen. At 270° C., solutions of 0.25M diisobutylphosphine selenide in N-dodecylpyrrolidone (DIBP-Se, 17.55 mL, 4.3 8 mmol) and 0.25M $Cd(Oleate)_2$ in trioctylphosphine/ODE (22.50 mL, 5.62 mmol) are rapidly injected, within a period of less than 1 second, followed by injection of ODE (76.0 mL) to rapidly drop the temperature to about 240° C., resulting in the production of quantum dots with an initial absorbance peak between 420-450 nm. 5-20 seconds after the ODE quench, a solution of $Cd(Oleate)_2$ (0.5M in a 50/50 v/v mixture of TOP and ODE) is continuously introduced along with a solution of DIBP-Se (0.4M in a 60/40 v/v mixture of N-dodecylpyrrolidone and ODE) at a rate of 55.7 mL/hr. At 15 min, the infusion rate is increased to 111.4 mL/hr. At 25 min, the infusion rate is increased to 167.1 mL/hour. At 35 min, the infusion rate is increased to 222.8 mL/hr. At 45 min, the infusion rate is increased to 297.0 mL/hr. At 55 min, the infusion rate is increased to 396.0 mL/hr. A total of 149.7 mL of each precursor is delivered while the temperature of the reactor is maintained between 215-240° C. At the end of the infusion, the reaction vessel is cooled using room temperature airflow over a period of 5-15 min. The final material is used as is without further purification (First absorbance peak: 576 nm, total volume: 736.5 mL, Reaction yield: 99%). The absorption spectrum of the core is shown in FIG. 3A.

EXAMPLE VIIIB

Figure 3B:
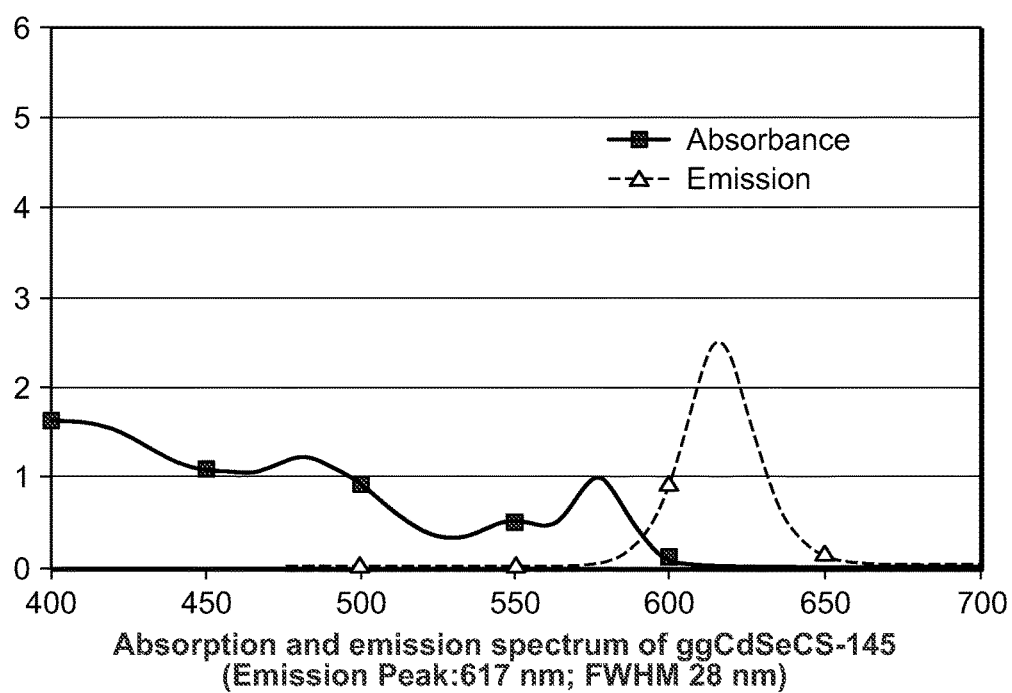
FIG. 3B graphically illustrates the absorption and emission spectra referred to in Example VIIIB.

Synthesis of CdSe/ZnS/CdZnS Core/Shell/Shell: CdSe cores synthesized as described in the preceding paragraph, with a first absorbance peak of 576 nm (90.10 mL, 8.70 mmol Cd), are mixed with $Zn(Oleate)_2$ (47.62 mL, 0.5M in TOP, 23.81 mmol). The solution is heated to 320° C., upon which a syringe containing 1-dodecanethiol (8.55 mL, 35.7 mmol) is swiftly injected. After 10 min of annealing between 305-325° C., the overcoat precursors are delivered via a syringe pump over a period of 30 min. The two overcoating precursor stocks include the following: 1) $Zn(Oleate)_2$ (89.73 mL, 0.5M in TOP, 44.87 mmol) mixed with $Cd(Oleate)_2$ (104.68 mL, 1.0M in TOP, 104.68 mmol), and 2) dodecanethiol (70.59 mL, 294.70 mmol) mixed with 1-octadecene (21.29 mL) and TOP (5.32 mL). During the overcoating precursor infusion, the temperature is kept between 320-330° C. Any volatiles from the system are allowed to distill over and leave the system in order for the temperature to reach 320-330° C. After the infusion ends, the sample is annealed for 5 min at 320-330° C. and cooled to room temperature over a period of 5-15 min. The final core/shell material is precipitated via the addition of butanol and methanol at a 2:1 ratio v/v. The pellet is isolated via centrifugation, and redispersed into toluene (200 mL) for storage (Emission 617 nm, FWHM 30 nm, Film EQE at RT: 92%, Film EQE at 140° C.: 75-80%). Absorption and emission spectra of the resulting overcoated nanocrsytals are shown in FIG. 3B.

EXAMPLE IX

Semiconductor Nanocrystals Capable of Emitting Green Light

Synthesis of CdSe Cores (447 nm Target): The following are added to a 100 mL glass reaction vessel: trioctylphosphine oxide (1.89 g), N-dodecylpyrrolidone (6.91 g), 1-octadecylphosphonic acid (1.2 g, 3.59 mmol), and $Cd(Oleate)_2$ (1M solution in trioctylphosphine, 3.60 mL, 5.30 mmol). The vessel is subjected to 3 cycles of vacuum/nitrogen at 120° C., and the temperature is raised to 270° C. under nitrogen. At 270° C., a solution of 1M diisobutylphosphine selenide in N-dodecylpyrrolidone (DIBP-Se, 2.81 mL, 2.81 mmol) is rapidly injected, within a period of less than 1 second, followed by injection of 1-octadecene (2.93 mL) to rapidly drop the temperature to about 240° C. resulting in the production of quantum dots with an initial absorbance peak between 420-430 nm. 5-20 seconds after the ODE injection, a solution of $Cd(Oleate)_2$ (0.5M in a 50/50 v/v mixture of TOP and ODE) is continuously introduced along with a solution of DIBP-Se (0.4M in a 60/40 v/v mixture of N-dodecylpyrrolidone and) at a rate of 1.06 mL/min. A total of 1.89 mL of each precursor is delivered while the temperature of the reactor is maintained between 225-235° C. At the end of the infusion, the reaction vessel is cooled rapidly via air gun <150° C. (within 2 minutes). The final material is used as is without further purification (First absorbance peak: 447 nm, Total volume: 24 mL).

Solid state external quantum efficiency" (also referred to herein as "EQE" or "solid state photoluminescent efficiency) can be measured in a 12" integrating sphere using a NIST traceable calibrated light source, using the method developed by Mello et al., *Advanced Materials* 9(3):230 (1997), which is hereby incorporated by reference. Such measurements can also be made with a QEMS from LabSphere (which utilizes a 4 in sphere; e.g. QEMS-2000: World Wide Website laser2000.nl/upload/documenten/fop_21-en2.pdf).

As used herein, the singular forms "a", "an" and "the" include plural unless the context clearly dictates otherwise. Thus, for example, reference to an emissive material includes reference to one or more of such materials.

Applicants specifically incorporate the entire contents of all cited references in this disclosure. Further, when an amount, concentration, or other value or parameter is given as either a range, preferred range, or a list of upper preferable values and lower preferable values, this is to be understood as specifically disclosing all ranges formed from any pair of any upper range limit or preferred value and any lower range limit or preferred value, regardless of whether ranges are separately disclosed. Where a range of numerical values is recited herein, unless otherwise stated, the range is intended to include the endpoints thereof, and all integers and fractions within the range. It is not intended that the scope of the invention be limited to the specific values recited when defining a range.

Other embodiments of the present invention will be apparent to those skilled in the art from consideration of the present specification and practice of the present invention disclosed herein. It is intended that the present specification and examples be considered as exemplary only with a true scope and spirit of the invention being indicated by the following claims and equivalents thereof.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A method for making quantum dots comprising:
combining quantum dot precursors in a liquid medium at a reaction temperature to form a reaction mixture; where the quantum dot precursors include a first quantum dot precursor that comprises an X donor and a second quantum dot precursor that comprises a metal; rapidly quenching the reaction mixture to a temperature below 100° C. in a liquid nitrogen bath to arrest nucleation, growth and ripening thereby resulting in seed core quantum dots; where the seed core quantum dots have a first absorbance peak of 420 to 480 nm, which are formed within 0.5 to 10 seconds after an injection of both the X donor and the metal; and
combining the seed core quantum dots with additional amounts of each of the quantum dot precursors under conditions suitable to increase the size of the seed core quantum dots to obtain quantum dot cores having a first absorbance peak of between about 450 nm to about 600 nm.

2. A method in accordance with claim 1 wherein X comprises oxygen, sulfur, selenium, tellurium, nitrogen, phosphorus, arsenic, or antimony.

3. A method in accordance with claim 2 wherein the metal comprises cadmium, zinc, magnesium, mercury, aluminum, gallium, indium, thallium, lead or germanium.

4. A method in accordance with claim 1 wherein the solution further includes carboxylate species.

5. A method in accordance with claim 1 wherein the step of quenching includes cooling the reaction mixture upon completion of combining the quantum dot precursors to a quenching temperature effective to terminate or quench the nucleation process in a manner to stop or limit further growth of the seed core quantum dots.

6. A method in accordance with claim 1 wherein the step of quenching includes cooling the reaction mixture upon completion of combining the quantum dot precursors and prior to ripening.

7. A method in accordance with claim 5 further comprising isolating the seed core quantum dots after cooling and prior to combining the seed core quantum dots with the additional amounts of each of the quantum dot precursors.

8. A method in accordance with claim 1 wherein X comprises oxygen, sulfur, selenium, tellurium, nitrogen, phosphorus, arsenic, or antimony and wherein the metal comprises cadmium, zinc, magnesium, mercury, aluminum, gallium, indium, thallium, lead or germanium, and wherein the ratio of moles of X donor to moles Hof metal included in the reaction mixture solution is greater than or equal to 1.

9. A method in accordance with claim 1 wherein the quantum dots are made in the absence of an amine.

10. A method in accordance with claim 7 further including forming a coating comprising a composition that is different from that of the quantum dot cores over at least a portion of an outer surface of at least a portion of the quantum dot cores without a prior purification step.

11. A method in accordance with claim 10 wherein the coating comprises more than one semiconductor material.

12. A method in accordance with claim 10 wherein the coating comprises two or more layers.

13. A method in accordance with claim 10 wherein the coating is formed in the presence of a carboxylate species.

14. A method in accordance with claim 10 wherein the coating is formed in the absence of an amine.

15. A method in accordance with claim 1 wherein the seed core quantum dots are isolated and then exposed to additional amounts of each of the quantum dot precursors under suitable reaction conditions such that the seed core quantum dots grow in size using the additional amounts of each of the quantum dot precursors.

16. A method in accordance with claim 1 wherein the additional quantum dot precursors are provided to a reaction vessel including the seed core quantum dots as a substantially steady or substantially constant infusion or feed or source such that as the quantum dot precursors are consumed or otherwise used to grow the seed core quantum dots, additional amounts of each of the quantum dot precursors are provided to the reaction vessel in a substantially continuous manner to continue growth of the seed core quantum dots until a desired quantum dot core size is reached.

* * * * *